(12) United States Patent
Gong et al.

(10) Patent No.: US 11,948,618 B2
(45) Date of Patent: Apr. 2, 2024

(54) NON-VOLATILE ANALOG RESISTIVE MEMORY CELLS IMPLEMENTING FERROELECTRIC SELECT TRANSISTORS

(71) Applicant: International Business Machines Corporation, Armonk, NY (US)

(72) Inventors: Nanbo Gong, White Plains, NY (US); Takashi Ando, Eastchester, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 18/133,867

(22) Filed: Apr. 12, 2023

(65) Prior Publication Data
US 2023/0274773 A1    Aug. 31, 2023

Related U.S. Application Data

(62) Division of application No. 17/563,687, filed on Dec. 28, 2021, now Pat. No. 11,727,977, which is a (Continued)

(51) Int. Cl.
*G11C 11/22* (2006.01)
(52) U.S. Cl.
CPC ...... *G11C 11/2275* (2013.01); *G11C 11/2255* (2013.01); *G11C 11/2257* (2013.01); *G11C 11/2273* (2013.01); *G11C 11/2297* (2013.01)
(58) Field of Classification Search
CPC .......... G11C 11/2275; G11C 11/2255; G11C 11/2257; G11C 11/2273
See application file for complete search history.

(56) References Cited

U.S. PATENT DOCUMENTS 6,844,582 B2    1/2005  Ueda et al.
9,070,441 B2    6/2015  Otsuka et al.
(Continued)

FOREIGN PATENT DOCUMENTS

CN    104134457 A    11/2014
CN    106531887 A    3/2017
(Continued)

OTHER PUBLICATIONS

S. Oh et al., "Ferroelectric Materials for Neuromorphic Computing," APL Materials, Sep. 19, 2019, 14 pages, vol. 7.
(Continued)

*Primary Examiner* — Han Yang
(74) *Attorney, Agent, or Firm* — Erik Johnson; Ryan, Mason & Lewis, LLP

(57) ABSTRACT

A device includes a non-volatile analog resistive memory cell. The non-volatile analog resistive memory device includes a resistive memory device and a select transistor. The resistive memory device includes a first terminal and a second terminal. The resistive memory device has a tunable conductance. The select transistor is a ferroelectric field-effect transistor (FeFET) device which includes a gate terminal, a source terminal, and a drain terminal. The gate terminal of the FeFET device is connected to a word line. The source terminal of the FeFET device is connected to a source line. The drain terminal of the FeFET device is connected to the first terminal of the resistive memory device. The second terminal of the resistive memory device is connected to a bit line.

20 Claims, 9 Drawing Sheets

Related U.S. Application Data division of application No. 17/119,350, filed on Dec. 11, 2020, now Pat. No. 11,232,824.

(56) References Cited

U.S. PATENT DOCUMENTS

| | | | |
|---|---|---|---|
| 9,646,690 | B2 | 5/2017 | Otsuka et al. |
| 10,460,817 | B2 | 10/2019 | Li et al. |
| 10,482,929 | B2 | 11/2019 | Li et al. |
| 10,528,643 | B1 | 1/2020 | Choi et al. |
| 11,145,676 | B1 | 10/2021 | Chiang et al. |
| 2017/0193365 | A1 | 7/2017 | Park et al. |
| 2018/0277683 | A1 | 9/2018 | Han et al. |
| 2018/0300626 | A1 | 10/2018 | Lee |
| 2018/0349761 | A1* | 12/2018 | Lee .................. G06N 3/049 |
| 2019/0012593 | A1 | 1/2019 | Obradovic et al. |
| 2019/0019551 | A1 | 1/2019 | Lee |
| 2019/0034111 | A1 | 1/2019 | Catthoor et al. |
| 2019/0172539 | A1 | 6/2019 | Slesazeck et al. |
| 2019/0280694 | A1 | 9/2019 | Obradovic et al. |
| 2019/0287617 | A1 | 9/2019 | Tanaka et al. |
| 2021/0175253 | A1 | 6/2021 | Han et al. |

FOREIGN PATENT DOCUMENTS

| | | | |
|---|---|---|---|
| WO | 2018071143 | A2 | 4/2018 |
| WO | 2018217269 | A1 | 11/2018 |
| WO | 2019139598 | A1 | 7/2019 |

OTHER PUBLICATIONS

S. Kim et al., "Analog CMOS-Based Resistive Processing Unit for Deep Neural Network Training," IEEE 60th International Midwest Symposium on Circuits and Systems (MWSCAS), Aug. 6-9, 2017, pp. 422-425.

N. Gong et al., "Signal and Noise Extraction from Analog Memory Elements for Neuromorphic Computing," Nature Communications, May 29, 2018, pp. 1-8, vol. 9, No. 1.

T. Gokmen et al., "Acceleration of Deep Neural Network Training with Resistive Cross-Point Devices: Design Considerations," Frontiers in Neuroscience, Jul. 21, 2016, 13 pages, vol. 10, No. 333.

J.-W. Jang et al., "Optimization of Conductance Change in Pr1-xCaxMnO3-Based Synaptic Devices for Neuromorphic Systems," IEEE Electron Device Letters, May 2015, pp. 457-459, vol. 36, No. 5.

J. Müller et al., "Integration Challenges of Ferroelectric Hafnium Oxide Based Embedded Memory," ECS Transactions, Oct. 11-15, 2015, pp. 85-95, vol. 69, No. 3.

J. Woo et al., "Optimized Programming Scheme Enabling Linear Potentiation in Filamentary HfO2 RRAM Synapse for Neuromorphic Systems," IEEE Transactions on Electron Devices, Dec. 16, 2016, pp. 5064-5067, vol. 63, No. 12.

M. Jerry et al., "Ferroelectric FET Analog Synapse for Acceleration of Deep Neural Network Training," IEEE International Electron Devices Meeting (IEDM), Dec. 2-6, 2017, 4 pages.

N. Gong et al., "Nucleation Limited Switching (NLS) Model for HfO2-Based Metal-Ferroelectric-Metal (MFM) Capacitors: Switching Kinetics and Retention Characteristics," Applied Physics Letters, Jun. 25, 2018, 5 pages, vol. 112.

International Search Report and Written Opinion of PCT/CN2021/129586, dated Feb. 11, 2022.

List of IBM Patents or Patent Applications Treated as Related.

Australian Examination Report for Application No. AU2021395683, dated Sep. 7, 2023, 3 pages.

* cited by examiner $$y = W \times x$$
FORWARD PASS $$z = W^T \times \delta$$
BACKWARD PASS $$w_{ij} \leftarrow w_{ij} + \eta x_i \times \delta_j$$
WEIGHT UPDATE 1100
(SL1, SL2, AND WL2 HELD AT GND)

1110
(SL1, WL1, AND BL HELD AT GND)

NON-VOLATILE ANALOG RESISTIVE MEMORY CELLS IMPLEMENTING FERROELECTRIC SELECT TRANSISTORS

BACKGROUND

This disclosure relates generally to non-volatile analog resistive memory cells for neuromorphic computing, and techniques for conductance tuning of resistive memory devices of non-volatile analog resistive memory cells. Information processing systems such as Neuromorphic computing systems and artificial neural network (ANN) systems are utilized in various applications such as machine learning and inference processing for cognitive recognition and computing. Such systems are hardware-based systems that generally include a large number of highly interconnected processing elements (referred to as "artificial neurons") that operate in parallel to perform various types of computations. The artificial neurons (e.g., pre-synaptic neurons and post-synaptic neurons) are connected using artificial synaptic devices which provide synaptic weights that represent connection strengths between the artificial neurons. The synaptic weights can be implemented using analog memory elements, such as tunable resistive memory devices, which exhibit non-volatile and multi-level memory characteristics.

SUMMARY

Embodiments of the disclosure include non-volatile analog resistive memory cells which comprise ferroelectric select transistors and resistive memory devices, methods for programming and reading non-volatile analog resistive memory cells which comprise ferroelectric select transistors and resistive memory devices, and computing systems that include arrays of non-volatile analog resistive memory cells which comprise ferroelectric select transistors and resistive memory devices.

In an exemplary embodiment, a device comprises a non-volatile analog resistive memory cell. The non-volatile analog resistive memory device comprises a resistive memory device and a select transistor. The resistive memory device comprises a first terminal and a second terminal. The resistive memory device comprises a tunable conductance. The select transistor comprises a ferroelectric field-effect transistor (FeFET) device which comprises a gate terminal, a source terminal, and a drain terminal. The gate terminal of the FeFET device is connected to a word line. The source terminal of the FeFET device is connected to a source line. The drain terminal of the FeFET device is connected to the first terminal of the resistive memory device. The second terminal of the resistive memory device is connected to a bit line.

Another exemplary embodiment includes a method which comprises applying programming pulses on a word line to program a non-volatile analog resistive memory cell coupled to the word line. The non-volatile analog resistive memory cell comprises a select transistor comprising a FeFET device which is connected to the word line, and a resistive memory device connected to the FeFET device. The application of the programming pulses causes: modulating a polarization state of the FeFET device in response to the programming pulses applied to the FeFET device from the word line, wherein the modulation of the polarization state of the FeFET device causes a modulation of a programming current for tuning a conductance of the resistive memory device; and tuning the conductance of the resistive memory device by incrementally changing the conductance of the resistive memory device by the modulated programming current which is generated upon an activation of the FeFET device in response to each programming pulse applied to the FeFET device.

Other embodiments will be described in the following detailed description of exemplary embodiments, which is to be read in conjunction with the accompanying figures.

BRIEF DESCRIPTION OF THE DRAWINGS

FIGS. 7A, 7B, and 7C schematically illustrate methods for utilizing multi-domain partial polarization switching in a ferroelectric layer of an FeFET device to modulate a channel conductance of the FeFET device, according to an exemplary embodiment of the disclosure, wherein:

FIG. 7A graphically illustrates a channel conductance of an FeFET device as a function of pulse number for a plurality of identical programming pulses applied to a gate electrode of the FeFET device, according to an exemplary embodiment of the disclosure;

FIG. 7B schematically illustrates different polarization states of a ferroelectric layer of an FeFET which result from partial polarization switching in response to an increasing count of the potentiation pulses shown in FIG. 7A, according to an exemplary embodiment of the disclosure.

FIG. 7C schematically illustrates different polarization states of a ferroelectric layer of an FeFET which result from partial polarization switching in response to an increasing count of potentiation pulses which have an opposite polarity to the potentiation pulses shown in FIG. 7A, according to another exemplary embodiment of the disclosure.

DETAILED DESCRIPTION

Figure 1:
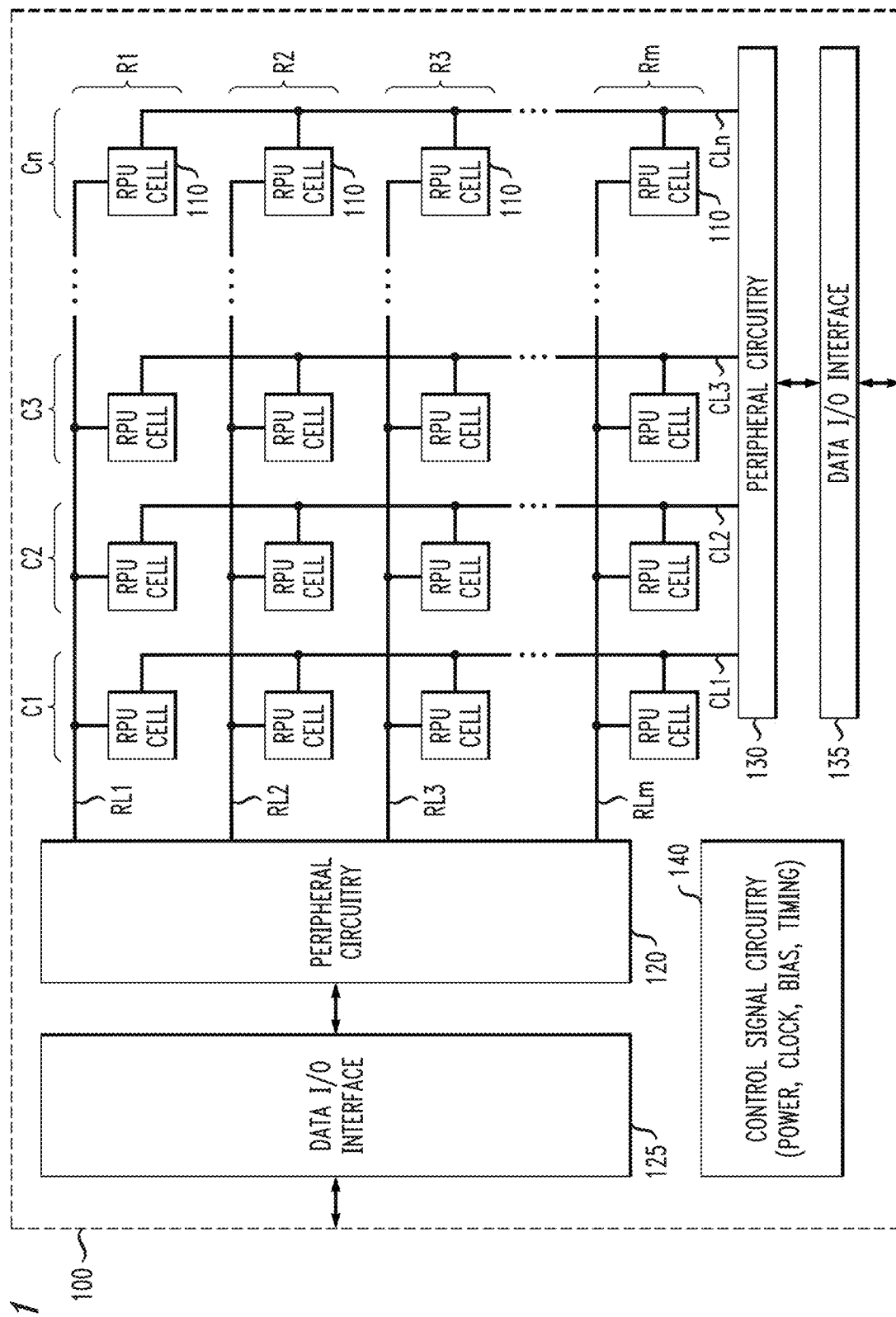
FIG. 1 schematically illustrates a computing system which comprises an array of non-volatile analog resistive memory cells that can implement ferroelectric select transistors and resistive memory devices, according to an exemplary embodiment of the disclosure.

Embodiments of the invention will now be described in further detail with regard to non-volatile analog resistive memory cells which comprise ferroelectric select transistors and resistive memory devices, methods for programming and reading non-volatile analog resistive memory cells which comprise ferroelectric select transistors and resistive memory devices, and computing systems that include arrays of non-volatile analog resistive memory cells which comprise ferroelectric select transistors and resistive memory devices. As explained in further detail below, a ferroelectric select transistor (alternatively referred to herein as FeFET select transistor) is configured to enhance the linearity in conductance tuning of analog resistive memory devices using a programming pulse scheme comprising identical programming pulses (e.g., same amplitude and pulse width).

It is to be understood that the various features as shown in the accompanying drawings are schematic illustrations that are not drawn to scale. In addition, for ease of illustration and explanation, one or more layers, structures, regions, features, etc., of a type commonly used to implement FeFET devices, resistive memory devices, and other devices or structures and system components as schematically shown in the drawings, may not be explicitly shown in a given drawing. This does not imply that any layers, structures, regions, features, etc., not explicitly shown are omitted from the actual devices or structure. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs. The word "over" as used herein to describe the orientation of a given feature with respect to another feature means that the given feature may be disposed or formed "directly on" (i.e., in direct contact with) the other feature, or that the given feature may be disposed or formed "indirectly on" the other feature with one or more intermediate features disposed between the given feature and the other feature.

Exemplary embodiments of the disclosure include computing systems or computational memory systems, which utilize an array of non-volatile analog memory cells for a dual purpose of storing data and processing the data to perform some computational tasks. The non-volatile analog memory cells (e.g., resistive processing units (RPUs)) implement resistive memory devices such as resistive random-access memory (ReRAM) devices, phase-change memory (PCM) devices, etc., which have a tunable conductance (G) with variable conductance states over a range from a min conductance (Gmin) to a maximum conductance (Gmax). As noted above, neuromorphic computing systems and ANN systems are types of in-memory computing systems in which artificial neurons are connected using artificial synaptic devices to provide synaptic weights which represent the strength of connection between two artificial neurons. The synaptic weights can be implemented using tunable resistive memory devices, wherein the variable conductance states are used to represent the synaptic weights and to perform computations (e.g., vector-matrix multiplication). The conductance states of the analog resistive memory devices are encoded or otherwise mapped to synaptic weights.

Various types of artificial neural networks, such as deep neural networks (DNNs) and convolutional neural networks (CNNs) implement neuromorphic computing architectures for machine learning applications such as image recognition, object recognition, speech recognition, etc. The in-memory computations associated with such neural networks include, e.g., training computations in which the synaptic weights of the resistive memory cells are optimized by processing a training dataset, and forward inference computations in which the trained neural networks are used to process input data for purposes of, e.g., classifying the input data, predicting events based on the input data, etc.

DNN training generally relies on a backpropagation algorithm which includes three repeating cycles: forward, backward and weight update, which are repeated many times until a convergence criterion is met. The forward and backward cycles mainly involve computing vector-matrix multiplication in forward and backward directions. This operation can be performed on a 2D array of analog resistive memory cells. In a forward cycle, stored conductance values of the resistive memory devices in the 2D array form a matrix, and an input vector is transmitted as voltage pulses through each input rows of the 2D array. In a backward cycle, voltage pulses are supplied from columns as an input, and a vector-matrix product is computed on the transpose of a matrix. The weight update involves calculating a vector-vector outer product which consists of a multiplication operation and an incremental weight update to be performed locally in each resistive memory cell within the 2D array.

A stochastically trained DNN comprising arrays of RPU cells can have synaptic weights implemented using tunable resistive memory devices. To properly train a DNN and achieve high-accuracy, the operating characteristics of the tunable resistive devices should meet a stringent set of specifications of acceptable RPU device parameters that a given DNN algorithm can tolerate without significant error penalty. These specifications include, for example, variations in the switching characteristics of the resistive memory device, such as, minimum incremental conductance change ($\pm \Delta g_{min}$) due to a single potentiation pulse, symmetry in up and down conductance changes, tunable range of the conductance values, etc.

In particular, one important specification for DNN training is that the RPU cells should have a tunable conductance with a resolution (or dynamic range) of at least 1000 conductance levels (or steps), wherein the conductance levels can be switched (via 1-ns pulses) from a lowest conductance state to a highest conductance state in an analog and symmetrically incremental manner (with at least one order of magnitude of conductance difference between the maximum and minimum conductance state (on/off ratio)). To achieve symmetry of up/down changes of a minimum unit weight value ($\pm \Delta w_{min}$) in an RPU cell, each incremental increase (step up, $\Delta g_{min}^+$) and incremental decrease (step down, $\Delta g_{min}^-$) in the associated conductance level of the RPU cell should be the same amount or a similar amount within no more than 5% mismatch error. In other words, tunable resistive RPU devices, which are analog in nature, should respond symmetrically in up and down conductance changes when provided the same but opposite pulse in stimulus. In particular, the Up/Down symmetry, $\Delta g_{min}^+/\Delta g_{min}^-$, should be equal to 1.0±0.05. It is to be noted that the parameter $\Delta g_{min}^\pm$ in is proportional to the parameter $\Delta w_{min}^\pm$ through an amplification factor defined by the peripheral circuitry. However, tunable resistive devices such as memristive devices (or memristors) typically exhibit variability in tuning/programming characteristics, making it difficult to achieve symmetric weight updates over the range (min-max) of conductance levels.

Despite these requirements, however, tunable resistive devices can exhibit limited dynamic range and resolution, as well as variability in tuning/programming characteristics, making it difficult to achieve symmetric weight updates over the range (min-max) of conductance levels. As such, the hardware implementation of the RPU architecture is non-trivial. More specifically, in reality, most resistive memory devices do not show symmetric switching behavior, but rather exhibit a highly non-linear evolution of conductance as a function of the number of consecutively applied pulses. This results in significant errors in weight updates. On the other hand, linearity of the resistance change, representing the identical incremental tuning of synaptic weight with the repetition of input pulses, is highly desired for fast learning with simple neuron circuit operation by determining the synaptic weight change using only a pulse count number. The symmetric tuning of synaptic weight for synaptic potentiation and depression is also preferred because it allows the neuron circuit to generate voltage pulses with the same amplitude and duration (e.g., referred to as an identical programming pulse scheme) but opposite polarities for potentiation and depression.

It is well known that resistive memory devices exhibit non-linear conductance tuning when using potentiation/depression programming schemes with identical programming pulses. As such, to achieve linearity in the conductance tuning of such resistive memory devices, potentiation/depression pulse schemes typically implement non-identical pulse schemes which involve modulating either the amplitude or the pulse width of the potentiation/depression pulses. For example, modulating the pulse amplitude involves increasing the amplitude of the pulses (with a fixed pulse width) for each sequential programming pulse applied to the resistive memory device to linearly increase (potentiation) or decrease (depression) the conductance of the resistive memory device in identical incremental tuning steps. On the other hand, modulating the pulse width involves increasing the pulse width of the pulses (with a fixed amplitude) for each sequential programming pulse applied to the resistive memory device to linearly increase (potentiation) or decrease (depression) the conductance of the resistive memory device in identical incremental tuning steps. These non-identical pulse schemes add overhead with regard to the peripheral circuitry and processing that is needed to implement amplitude and/or pulse width modulation. In addition, pulse width modulation results in increased latency in the programming operations.

As explained in further detail below, exemplary embodiments of the disclosure exploit the dynamics of voltage controlled partial polarization switching in a ferroelectric layer of a FeFET, which is utilized as a select transistor in a non-volatile analog resistive memory cell, to modulate a channel conductance of the FeFET device during a programming operation in which an identical potentiation pulse scheme or an identical depression pulse scheme is applied to tune the conductance of a resistive memory devices (e.g., synapse weight update). The modulation of the channel conductance of the FeFET device during the programming operation serves to improve the linearity in the conductance tuning of a resistive memory device using programming pulse scheme of identical pulses.

FIG. 1 schematically illustrates a computing system 100 which comprises an array of analog resistive memory cells that implement ferroelectric select transistors and resistive memory devices, according to an exemplary embodiment of the disclosure. In particular, FIG. 1 schematically illustrates a neuromorphic computing system which is implemented using a crossbar arrays of resistive processing units. The computing system 100 comprises a two-dimensional (2D) crossbar array of RPU cells 110 arranged in a plurality of rows R1, R2, R3, . . . , Rm, and a plurality of columns C1, C2, C3, . . . Cn. The RPU cells 110 in each row R1, R2, R3, . . . , Rm are commonly connected to respective row control lines RL1, RL2, RL3, . . . , RLm (collectively, row control lines RL). The RPU cells 110 in each column C1, C2, C3, . . . , Cn are commonly connected to respective column control lines CL1, CL2, CL3, . . . , CLn (collectively, column control lines CL). Each RPU cell 110 is connected at (and between) a cross-point (or intersection) of a respective row line and column line. In one example embodiment, the RPU system 100 comprises a 4,096×4,096 array of RPU cells 110.

The computing system 100 further comprises peripheral circuitry 120 connected to the row control lines RL1, RL2, RL3, . . . , RLm, as well peripheral circuitry 130 connected to the column control lines CL1, CL2, CL3, . . . , CLn. Further, the peripheral circuitry 120 is connected to a data input/output (I/O) interface block 125, and the peripheral circuitry 130 is connected to a data I/O interface block 135. The computing system 100 further comprises control signal circuitry 140 which comprises various types of circuit blocks such as power, clock, bias and timing circuitry to provide power distribution and control signals and clocking signals for operation of the computing system 100.

In some embodiments, each RPU cell 110 in the computing system 100 comprises a non-volatile analog resistive memory cell which implements a ferroelectric select transistor and a resistive memory device. In some embodiments, the RPU cells 110 are implemented using one of the exemplary embodiments of non-volatile analog resistive memory cell frameworks schematically illustrated in FIGS. 3, 4, 5, 6, 7A-7C, 9 and 10, which will be discussed in further detail below. In some embodiments, each RPU cell 110 implements a resistive memory device such as a ReRAM device, PCM device, etc., which has a tunable conductance value that represents a matrix element or weight of the RPU cell 110.

In a neuromorphic computing application, the RPU cells 110 comprise artificial synapses that provide weighted connections between pre-neurons and post-neurons. Multiple pre-neurons and post-neurons are connected through the 2D crossbar array of RPU cells 110, which naturally expresses a fully-connected neural network. In some embodiments, the computing system 100 is configured to perform DNN or CNN computations wherein a conductance of each RPU cell 110 represents a matrix element or weight $w_{ij}$, which can be updated or accessed through operations of the peripheral circuitry 120 and 130 (wherein $w_{ij}$ denotes a weight value for the $i^{th}$ row and the $j^{th}$ column in the array of RPU cells 110). As noted above, DNN training generally relies on a backpropagation process which comprises three repeating cycles: a forward cycle, a backward cycle, and a weight update cycle. The computing system 100 can be configured to perform all three cycles of the backpropagation process in parallel, thus potentially providing significant acceleration in DNN training with lower power and reduced computation resources. The computing system 100 can be configured to perform vector-matrix multiplication operations in the analog domain in a parallel manner.

While the row control lines RL and column control lines CL are each shown in FIG. 1 as a single line for ease of illustration, it is to be understood that each row and column control line can include two or more control lines connected to the RPU cells 110 in the respective rows and columns, depending on the implementation and the specific architecture of the RPU cells 110. For example, in some embodiments, each row control line RL can include a complementary pair of word lines for a given RPU cell 110. Moreover, each column control line CL may comprise multiple control lines including, e.g., one or more source lines (SL) and one or more bit lines (BL). The peripheral circuitry 120 and 130 comprises various circuit blocks which are connected to the respective rows and columns in the 2D array of RPU cells 110, and which are configured to perform vector-matrix multiply functions, matrix-vector multiply functions, and outer product update operations to implement the forward, backward and weight update operations of a backpropagation process (for neural network training), as well inference processing using a trained neural network. For example, in some embodiments, to support RPU cell read/sensing operations (e.g., read a weight value of given RPU cell 110), the peripheral circuitry 120 and 130 comprises pulse-width modulation (PWM) circuitry and read pulse driver circuitry to generate and apply PWM read pulses to the RPU cells 110, in response to input vector values (read input values) received during forward/backward cycles.

More specifically, in some embodiments, the peripheral circuitry 120 and 130 comprises digital-to-analog (D/A) converter circuitry that is configured to receive digital input vectors (to be applied to rows or columns) and convert the digital input vector into analog input vector values that are represented by input voltage voltages of varying pulse width. In some embodiments, a time-encoding scheme is used when input vectors are represented by fixed amplitude Vin=1 V pulses with a tunable duration (e.g., pulse duration is a multiple of 1 ns and is proportional to the value of the input vector). The input voltages applied to rows (or columns) generate output vector values which are represented by output currents, wherein the weights of the RPU cells 110 are read out by measuring the output currents.

The peripheral circuitry 120 and 130 further comprises current integrator circuitry and analog-to-digital (A/D) converter circuitry to integrate read currents ($I_{READ}$) which are output and accumulated from the connected RPU cells 110 and convert the integrated currents into digital values (read output values) for subsequent computation. In particular, the currents generated by the RPU cells 110 are summed on the columns (or rows) and this total current is integrated over a measurement time, tmeas, by current readout circuitry of the peripheral circuitry 120 and 130. The current readout circuitry comprises current integrators and analog-to-digital (A/D) converters. In some embodiments, each current integrator comprises an operational amplifier that integrates the current output from a given column (or row) (or differential currents from pairs of RPU cells implementing negative and positive weights) on a capacitor, and an analog-to-digital (A/D) converter converts the integrated current (e.g., an analog value) to a digital value.

Furthermore, the peripheral circuitry 120 and 130 comprises voltage generator and driver circuitry that is configured to generate programming voltages that are used during programming operations to update the conductance values of the resistive memory devices that are implemented in the RPU cells. In some embodiments, the peripheral circuit 120 and 130 implements the exemplary programming operations as discussed in further detail below the reference to FIGS. 7A, 7B, 7C and 8A.

The data I/O interfaces 125 and 135 are configured to interface with a digital processing core, wherein the digital processing core is configured to process input/outputs to the computing system 100 (neural core) and route data between different RPU arrays. The data I/O interfaces 125 and 135 are configured to (i) receive external control signals and data from a digital processing core and provide the received control signals and data to the peripheral circuitry 120 and 130, and (ii) receive digital read output values from peripheral circuitry 120 and 130, and send the digital read output values to a digital processing core for processing. In some embodiments, the digital processing core implements a non-linear function circuitry which calculates activation functions (e.g., sigmoid neuron function, softmax, etc.) and other arithmetical operations on data that is to be provided to a next or previous layer of a neural network.

As is known in the art, fully connected DNNs comprise stacks of fully connected layers such that a signal propagates from an input layer to an output layer by going through a series of linear and non-linear transformations. The entire DNN expresses a single differentiable error function that maps the input data to class scores at the output layer. Typically, a DNN is trained using a simple stochastic gradient decent (SGD) scheme, in which an error gradient with respect to each parameter is calculated using the backpropagation algorithm. The backpropagation algorithm is composed of three cycles, forward, backward and weight update that are repeated many times until a convergence criterion is met. The forward and backward cycles mainly involve computing vector-matrix multiplication operations in forward and backward directions using the 2D crossbar array of RPU device cells 110 of the computing system shown in FIG. 1.

Figure 2A:
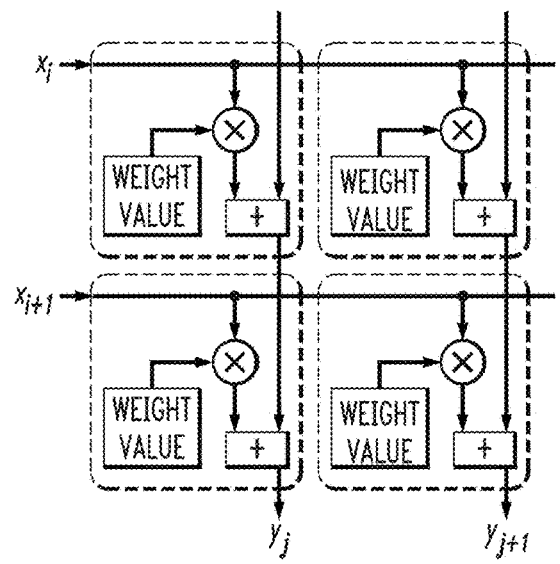
FIG. 2A schematically illustrates a forward pass operation of a backpropagation process, which can be performed using the computing system of FIG. 1.
Figure 2B:
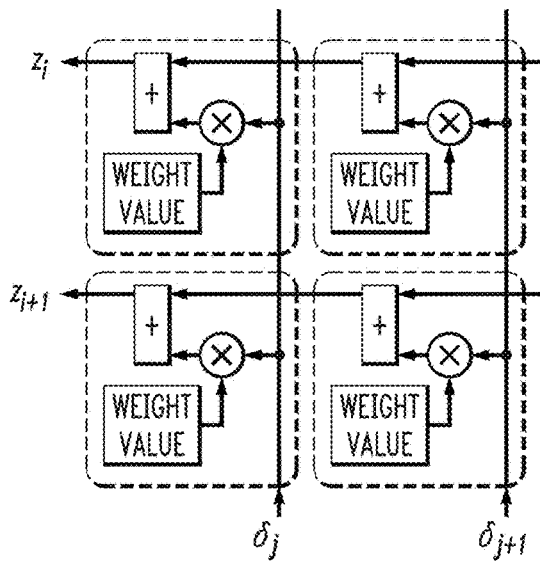
FIG. 2B schematically illustrates a backward pass operation of a backpropagation process, which can be performed using the computing system of FIG. 1.
Figure 2C:
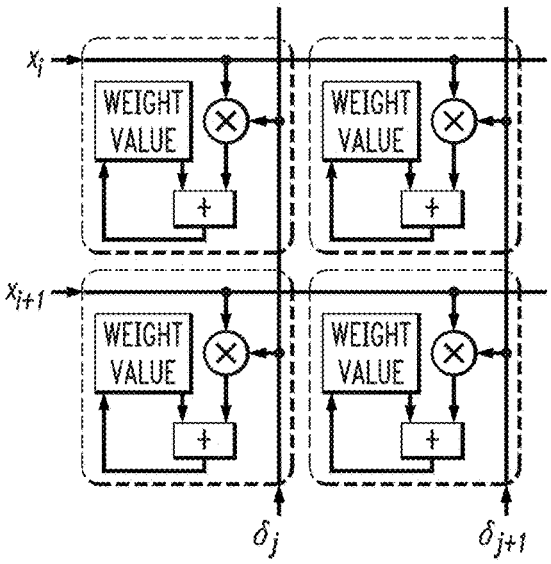
FIG. 2C schematically illustrates a weight update operation of a backpropagation process, which can be performed using the computing system of FIG. 1.

In the computing system 100 of FIG. 1, the conductance values $g_{ij}$ in the 2D crossbar array of RPU cells form a matrix W of weight values $w_{ij}$. In a forward cycle (FIG. 2A), an input vector (in the form of voltage pulses) is transmitted through each of the input rows in the 2D crossbar array to perform a vector-matrix multiplication in the RPU cells 110. In a backward cycle FIG. 2B), voltage pulses supplied from the columns are input to the RPU cells 110, and a vector-matrix product is computed on the transpose of the weight matrix W values. In contrast to forward and backward cycles, implementing the weight update on a 2D crossbar array of resistive devices requires calculating a vector-vector outer product which consists of a multiplication operation and an incremental weight update to be performed locally at each cross-point RPU device in the array. FIGS. 2A, 2B, and 2C schematically illustrate respective forward pass, backward pass, and weight update operations of a backpropagation algorithm which can be performed using the computing system 100 of FIG. 1.

For a single fully connected layer where N input neurons are connected to M output (or hidden) neurons, the forward pass (FIG. 2A) involves computing a vector-matrix multiplication y=Wx, where the vector x of length N represents the activities of the input neurons and the matrix W of size M×N stores the weight values between each pair of input and output neurons. The resulting vector y of length M is further processed by performing a non-linear activation on each of the elements and then passed to the next layer. Once the information reaches the final output layer, an error signal is calculated and back propagated through the network. In the forward cycle, the stored conductance values in the crossbar array of RPU cells 110 form a matrix, whereas the input vector is transmitted as voltage pulses through each of the input rows R1, R2, R3, . . . , Rm.

The backward cycle (FIG. 2B) on a single layer also involves a vector-matrix multiplication on the transpose of a weight matrix, $z=W^T\delta$, where W denotes the weight matrix, where the vector δ of length M represents the error calculated by the output neurons, and where the vector z of length N is further processed using the derivative of neuron non-linearity and then passed down to the previous layers. In a backward cycle, voltage pulses are supplied to the RPU cells 110 from columns CL1, CL2, CL3, . . . , CLn as an input, and the vector-matrix product is computed on the transpose of the weight matrix W.

Finally, in an update cycle (FIG. 2C), the weight matrix W is updated by performing an outer product of the two vectors that are used in the forward and the backward cycles. In particular, implementing the weight update on a 2D crossbar array of resistive devices locally and all in parallel, independent of the array size, requires calculating a vector-vector outer product which consists of a multiplication operation and an incremental weight update to be performed locally at each cross-point (RPU cell 110) in the computing system of FIG. 1. As schematically illustrated in FIG. 2C, the weight update process is computed as: $w_{ij} \leftarrow w_{ij} + \eta x_i \times \delta_j$, where $w_{ij}$ represents the weight value for the $i^{th}$ row and the $j^{th}$ column (for simplicity layer index is omitted), where $x_i$ is the activity at the input neuron, $\delta_j$ is the error computed by the output neuron, and where η denotes a global learning rate.

In summary, all operations on the weight matrix W can be implemented with using the 2D crossbar array of two-terminal RPU device with M rows and N columns where the stored conductance values in the crossbar array form the matrix W. In the forward cycle, input vector x is transmitted as voltage pulses through each of the rows and the resulting vector y can be read as current signals from the columns. Similarly, when voltage pulses are supplied from the columns as an input in the backward cycle, then a vector-matrix product is computed on the transpose of the weight matrix $W^T$. Finally, in the update cycle, voltage pulses representing vectors x and δ are simultaneously supplied from the rows and the columns. In the update cycle, each RPU cell 110 performs a local multiplication and summation operation by processing the voltage pulses coming from the column and the row and hence achieving an incremental weight update.

To determine the product of the xi and δj vectors for the weight update cycle, stochastic translator circuitry in the peripheral circuitry 120 and 130 is utilized to generate stochastic bit streams that represent the input vectors xi and δj. The stochastic bit streams for the vectors xi and δj are fed through rows and columns in the 2D crossbar array of RPU cells, wherein the conductance of a given RPU cell will change depending on the coincidence of the xi and δj stochastic pulse streams input to the given RPU cell. The vector cross product operations for the weight update operation are implemented based on the known concept that coincidence detection (using an AND logic gate operation) of stochastic streams representing real numbers is equivalent to a multiplication operation. All three operating modes described above allow the RPU cells forming the neural network to be active in all three cycles and, thus, enable a very efficient implementation of the backpropagation algorithm to compute updated weight values of the RPU cells during a DNN training process.

Figure 3:
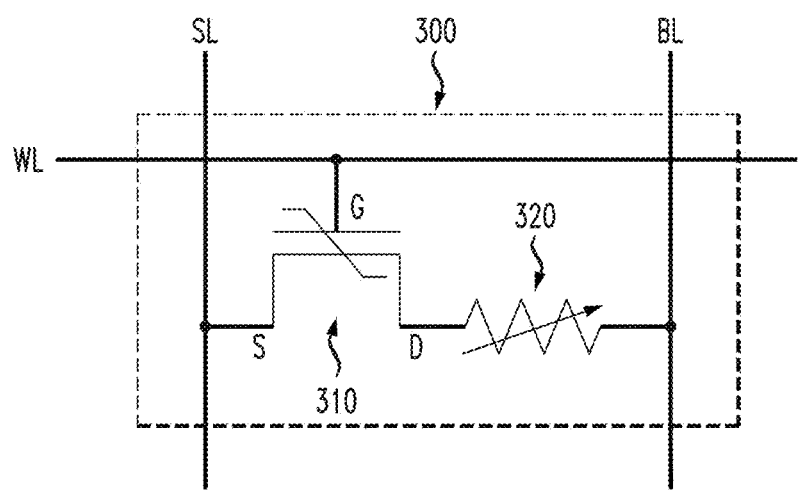
FIG. 3 schematically illustrates a non-volatile analog resistive memory cell which implements a ferroelectric select transistor and a resistive memory device, according to an exemplary embodiment of the disclosure.

FIG. 3 schematically illustrates an analog resistive memory cell which implements a ferroelectric select transistor and a resistive memory device, according to an exemplary embodiment of the disclosure. In particular, FIG. 3 schematically illustrates a non-volatile analog resistive memory cell 300 which comprises an FeFET device 310 and a resistive memory device 320. The memory cell 300 comprises a 1T-1R architecture (alternatively, 1F-1R architecture) where the FeFET device 310 operates as a select transistor for the memory cell 300, and the resistive memory device 320 operates as a storage element for the memory cell 300. In particular, the resistive memory device 320 is a programmable resistive memory element which is depicted as a variable resistor. As shown in FIG. 3, the FeFET device 310 (alternatively referred to herein as FeFET select transistor 310 or ferroelectric select transistor 310) comprises a gate G terminal, a drain D terminal, and a source S terminal. The gate G terminal is connected to a word line WL, the source S terminal is connected to a source line SL, and the drain D terminal is connected to a terminal of the resistive memory device 320. The resistive memory device 320 is connected between the drain D terminal and a bit line BL.

The memory cell 300 can be implemented as, e.g., an RPU cell of the computing system 100 (FIG. 1) to implement artificial neural network or neuromorphic computing system, etc. The resistive memory device 320 may be implemented using any suitable type of resistive memory device (e.g., resistive switching device (interfacial or filamentary switching), ReRAM, memristor, PCM, etc.) which has tunable conductance (or tunable resistance level) which can be programmatically adjusted within a range of a plurality of different conductance levels to tune the weight of the non-volatile analog resistive memory cell 300. As explained in further detail below, the FeFET device 310 enhances the linear response of the conductance tuning of the resistive memory device 320 during programming operations (e.g., weight update phase of SGD training process) that are performed to adjust the weight of the non-volatile analog resistive memory cell 300.

Figure 4:
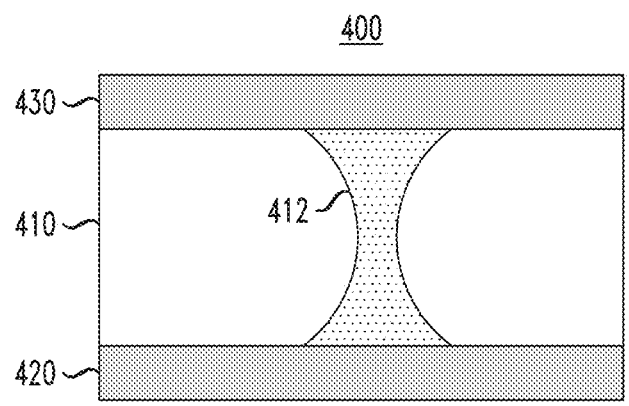
FIG. 4 schematically illustrates a resistive memory device which can be implemented in a non-volatile analog resistive memory cell, according to an exemplary embodiment of the disclosure.

FIG. 4 schematically illustrates a resistive memory device which can be implemented as a storage element in a non-volatile analog resistive memory cell that implements a ferroelectric select transistor, according to an exemplary embodiment of the disclosure. In particular, FIG. 4 schematically illustrates a resistive switching device 400 (e.g., resistive random-access memory (ReRAM) device) which comprises an insulating layer 410 disposed between a first electrode 420 and a second electrode 430. In some embodiments, the insulating layer 410 comprises an oxide layer (insulating layer) that is formed of a transition metal-oxide material, or a silicon oxide material (e.g., SiON). The insulating layer 410 serves as a programmable element (resistive switching layer) which exhibits a variable conductance (or different resistance states), wherein a change in the conductance is achieved by changing a configuration (e.g., formation, rupturing, dissolving, etc.) of a conductive filament (CF) 412 within the insulating layer 410 between the first and second electrodes 420 and 430. Depending on the structural configuration, the resistive memory device 400 can be single-level resistive device or a multi-level resistive memory device.

More specifically, with the resistive switching device 400, an "electroforming" process is typically performed to initially create one or more conductive filaments before using the resistive switching device 400 for repeatable resistive switching. Depending on the configuration, the resistive switching device 400 exhibits a switching behavior wherein the device 400 can switch between a low-resistance state (LRS) (or high conductance state), a high-resistance (HRS) (or low conductance state), and a plurality of intermediate-resistance states (IRS) by controlling a magnitude and/or duration of a write voltage signal applied across the first and second electrodes 420 and 430. The switching between the HRS and LRS is controlled by a RESET voltage (e.g., negative pulse with given magnitude (e.g., −1.8V) and duration (e.g., 100 nanoseconds)), and a SET voltage (e.g., positive pulse with given magnitude (e.g., +1.7 V) and duration (e.g., 100 nanosecond)).

During a SET operation, the application of the SET voltage across the electrodes 420 and 430 of the resistive switching device 400 results in the formation of one or more local conducting filaments 412 in the insulating layer 410, causing the resistive switching device 400 to be switched (SET) to the LRS or "on-state" with increased conductance. To transition to another state, a RESET operation is performed by applying a RESET voltage across the electrodes 420 and 430 of the resistive memory device 400 to cause dissolution/disruption/rupture of the conductive filament(s) 412, and place the resistive switching device 400 into the FIRS or "off-state." The resistive switching device 400 can switch interchangeably between all resistance states, including (i) direct SET switching from the HRS sate to an IRS state or the LRS state, (ii) direct RESET switching from the LRS state to the IRS state or HRS state, and (iii) SET/RESET switching from an IRS state to the LRS state or FIRS state by controlling the magnitude of the applied write voltage signal. The thickness of the conductive filament 412 can be controlled (e.g., forming, dissolving, rupturing) in different ways, so that the resistive switching device 400 can exhibit continuously variable conductance values.

FIG. 4 schematically illustrates an exemplary embodiment of a filamentary resistive switching device. In other embodiments, an interfacial resistive switching device can be implemented as a storage element in a non-volatile analog resistive memory cell that implements a ferroelectric select transistor, according to exemplary embodiments as described herein. In general, an interfacial resistive switching device comprises one or more layers of insulating material disposed between first and second electrodes, wherein a magnitude of current flow through insulating layer(s) is based on a barrier height at an interface between the insulating layer(s) and an electrode (i.e., at a metal-insulator junction). The interface barrier height can be modified by control pulses, leading to binary or multiple resistance states of the interfacial resistive switching device, as is understood by those of ordinary skill in the art.

Figure 5:
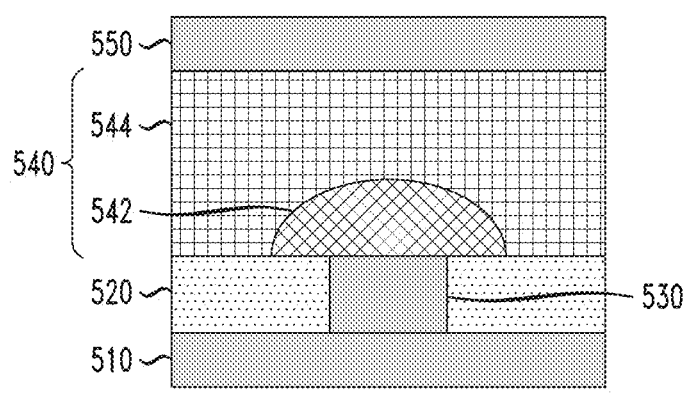
FIG. 5 schematically illustrates a resistive memory device which can be implemented in a non-volatile analog resistive memory cell, according to another exemplary embodiment of the disclosure.

FIG. 5 schematically illustrates a resistive memory device which can be implemented as a storage element in a non-volatile analog resistive memory cell that implements a ferroelectric select transistor, according to another exemplary embodiment of the disclosure. In particular, FIG. 5 schematically illustrates a phase change memory (PCM) device 500 which comprises a first (bottom) electrode 510, an insulating layer 520, a heater electrode 530, a layer of phase-change material 540, and a second (upper) electrode 550. The layer of phase-change material 540 comprises a first region 542 of material in an amorphous state (alternatively, amorphous region 542) and second region 544 of material in a crystalline state (alternatively, crystalline region 544). The amorphous region 542 tends to have high electrical resistivity, while the crystalline region 544 exhibits a low resistivity (e.g., several orders of magnitude lower in resistivity). With the PCM device 550, data is stored based on a contrast in the electrical resistance between the low-conductive amorphous region 542 and the high-conductive crystalline region 544 of the layer of phase-change material 540. Due to the large resistance contrast, the change in read current is relatively large, which enables the PCM device 500 to be implemented to provide multiple analog levels for MLC operation.

The phase-change material 540 can be switched from a low to a high conductive state, and vice-versa, by applying electrical current pulses to the PCM device 500 which incrementally changes the size of the first region 542 of material in the amorphous state. For example, a first type of pulse (e.g., SET pulse, or crystallizing pulse) with a first magnitude and first duration can be applied to the PCM device 500 to incrementally decrease the size of the first region 542 and thus incrementally decrease the resistance (or increase the conductance) of the PCM device 500. On the other hand, a second type of pulse (e.g., RESET pulse, or amorphizing pulse) with a second magnitude and second duration can be applied to the PCM device 500 to incrementally increase the size of the first region 542 and thus incrementally increase the resistance (or decrease the conductance) of the PCM device 500. The change in resistance of the PCM device 500 is the result of the initiation of a joule heating process which occurs due to an increased current density in the narrow heater electrode 530 when current pulses are applied across the electrode 550 and 510. In this joule heating process, the region (e.g., first region 542) of the phase-change material 540 near the heater electrode 530 is heated by an internal temperature increase, which causes crystallization of the phase-change material while the temperature is kept below the melting point of the phase-change material. In this regard, the programming of the PCM device 500 involves the application of electrical power through applied voltage, leading to internal temperature changes that either melt and then rapidly quench a volume of amorphous material (RESET), or hold the volume at a slightly lower temperature for sufficient time for recrystallization (SET). A low voltage is used to sense the device resistance (READ), so that the device state is not perturbed. Due to the stochastic nature in crystallization of the phase-change material 540, there is significant randomness associated with the weight updates.

Figure 6:
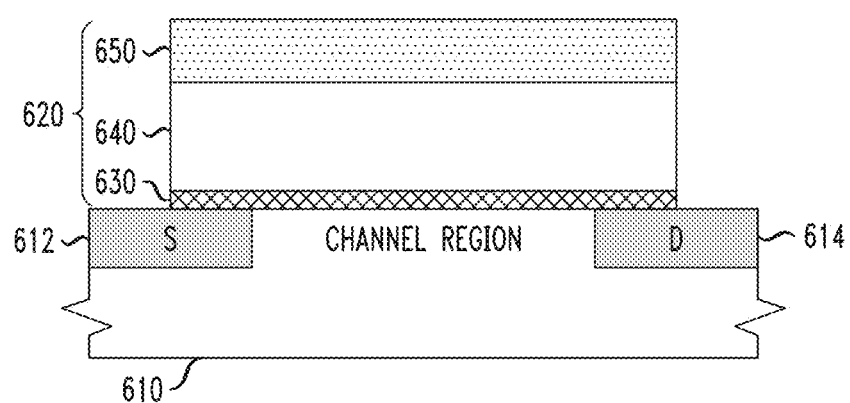
FIG. 6 is a schematic view of an FeFET device which can be implemented as a select transistor in a non-volatile analog resistive memory cell, according to an exemplary embodiment of the disclosure.

FIG. 6 is a schematic view of an FeFET device 600 which can be implemented as a select transistor in a non-volatile analog resistive memory cell, according to an exemplary embodiment of the disclosure. The FeFET device 600 comprises a semiconductor substrate 610, a first source/drain region 612, a second source/drain region 614, and a gate structure 620. The gate structure 620 comprises an interfacial layer 630, a ferroelectric layer 640, and a gate electrode 650. The substrate 610 comprises a "channel region" disposed below the gate structure 620 between the first and second source/drain regions 612 and 614. The FeFET device 600 has a structure that is similar to a metal-oxide-semiconductor field-effect transistor (MOSFET) device, with the exception that gate structure 620 of the FeFET device 600 comprises the ferroelectric layer 640 disposed between the gate electrode layer 650 and the upper surface of the semiconductor substrate 610.

The ferroelectric layer 640 comprises a ferroelectric material which has the ability to become spontaneously polarized in the presence of an electric field (referred to as coercive field), and retain a remnant polarization when unbiased. The remnant polarization refers to the polarization charge that remains within the ferroelectric material, positive or negative, after an external bias has been removed. The remnant polarization state of the ferroelectric layer 640 affects channel conductance of the FeFET device 600, wherein a change in the polarization state of the ferroelectric layer 640 (e.g., change in magnitude and/or polarity) causes a change in the channel conductance of the FeFET device 600. As explained in further detail below, exemplary embodiments of the disclosure exploit this conductance-polarization property of the FeFET device 600 by utilizing the FeFET device 600 as a select transistor in an analog non-volatile analog resistive memory cell to improve the linearity in the conductance tuning of a resistive memory device during, e.g., weight update process.

The substrate 610 is formed of a semiconductor material such as silicon or other suitable semiconductor materials. The substrate 610 can be a bulk substrate or a doped well that is formed in a bulk substrate. The substrate 610 can be doped to have a first conductivity type (e.g., N-type) or a second conductivity type (e.g., P-type). The first and second source/drain regions 612 and 614 are doped regions within the substrate 610 that have a conductivity type which is opposite the conductivity type of the substrate 610. For example, for an N-type FeFET device, the substrate 610 comprises a P-type conductivity, and the first and second source/drain regions 612 and 614 comprise an N-type conductivity (e.g., N$^+$ doping). For a P-type FeFET device, the substrate 610 comprises a N-type conductivity, and the first and second source/drain regions 612 and 614 comprises a P-type conductivity (e.g., P$^+$ doping). It is to be understood that the term "source/drain region" as used herein means that a given source/drain region can be either a source region or a drain region, depending on the application or circuit configuration. For illustrative purposes, the first source/drain region 612 is labeled as a source region, and the second source/drain region 614 is labeled as a drain region.

In some embodiments, the substrate 610 (i.e., body) comprises a separate "body terminal" which allows appropriate bias voltages (e.g., ground voltage) to be applied to the substrate 610 during programming operations and reading operations. For example, in some embodiments, the body terminal is connected to the source region 612 to ensure that there is zero voltage across the source/substrate junction, and to eliminate the "body effect" in which threshold voltage ($V_T$) can change as a result of voltage difference between the source and the body of the FeFET device 600.

In some embodiments, the interfacial layer 630 comprises a thin layer of insulating material including, but not limited to, a silicon oxide material (e.g., silicon dioxide), a silicon nitride material (e.g., SiN, SiON), or other suitable types of insulating materials. The ferroelectric layer 640 comprises a ferroelectric material including, but not limited to, a polycrystalline alloyed film of hafnium oxide (HfO$_2$), zirconium oxide (ZrO$_2$), hafnium zirconium oxide (HfZrO$_2$), and other types of high-k dielectric materials (e.g., hafnium oxides doped with aluminum, silicon, or yttrium) which can be formed with a crystalline microstructure that exhibits ferroelectric properties (e.g., orthorhombic ferroelectric phase). The interfacial layer 630 is an optional layer that is utilized for various purposes such as, e.g., providing a buffer layer to enhance the quality of the interface between the surface of the substrate 610 and the ferroelectric layer 640, reducing an amount of charge traps, and preventing reaction between the different materials of the ferroelectric layer 640 and the substrate 610, etc. In some non-limiting embodiments, the ferroelectric layer 640 has a thickness in a range of about 2 nanometers (nm) to about 20 nm. In some embodiments, the ferroelectric layer 640 is formed directly on the surface of the silicon substrate 610 (e.g., highly-doped Si substrate).

The gate electrode 650 comprises a conductive material including, but not limited to, titanium (Ti), titanium nitride (TiN), titanium silicide (TiSi), tantalum nitride (TaN), tungsten (W), tungsten silicide (WSi), ruthenium (Ru), rhenium (Re), nickel (Ni), platinum (Pt), iridium (Ir), or other types of conductive materials that are suitable for the given application. In some embodiments, material of the gate electrode 650 is selected to achieve a given work-function that influences the coercive voltage of the ferroelectric layer 640 in a manner that enhances performance of the FeFET device 600 when used, for example, as a select (or access) transistor of a non-volatile analog resistive memory cell.

It is to be understood that FIG. 6 is a high-level schematic illustration of an FeFET device which is presented for ease of illustration and discussion. The FeFET device 600 could include other elements such as, e.g., one or more insulating layers (e.g., gate sidewall spacers, gate capping layers, pre-metal dielectric (PMD) layers, etc.) encapsulating the gate structure 620, a gate contact formed in contact with the upper surface of the gate electrode 650, source/drain contacts formed in contact with the first and second source/drain regions 612 and 614, a body region formed in the substrate 610, and a body contact formed in contact with the body region, etc. In addition, the gate electrode 650 may comprise a multi-layer structure which comprises a first gate electrode layer (e.g., work function metal layer) formed on the ferroelectric layer 630, and a second gate electrode layer (e.g., low resistance metal layer) formed on the first gate electrode layer.

In some embodiments, the ferroelectric layer 640 is formed to have a polycrystalline microstructure which results the ferroelectric layer 640 having multiple ferroelectric domains. A polycrystalline microstructure comprises a mosaic of small crystallites (or grains) of varying size and randomly distributed with no preferred orientation (i.e., random texture and no grain direction). In some embodiments, various conditions and parameters of the fabrication process for the ferroelectric layer 640 can be selected such that the grains (or crystallites) of the ferroelectric layer 640 are grown to have a target alignment, resulting in a grain texture. The ferroelectric domains within the ferroelectric layer 640 can coincide with different grains or groups of grains within the polycrystalline structure of the ferroelectric layer 640.

In the context of the exemplary embodiments described herein, the term "ferroelectric domain" refers to a region of the ferroelectric layer 640 within which a permanent oriented spontaneous polarization can be obtained by applying a coercive electric field (e.g., coercive voltage) to the given region. In this regard, a given ferroelectric domain with the ferroelectric layer 640 can become spontaneously polarized in the presence of a coercive electric field. The permanent spontaneous polarization comprises a remnant polarization (or remnant polarization charges) which remains within the given region(s) of the ferroelectric material, either positive or negative, after the coercive electric field is removed. The coercive electric filed denotes a magnitude of an electric field which, if applied to the ferroelectric material, is sufficient to induce switching from a positive polarization charge to a negative polarization charge, and vice versa. In general, a coercive voltage is a function of the thickness of the ferroelectric film multiplied by the coercive field value.

Figure 7A:
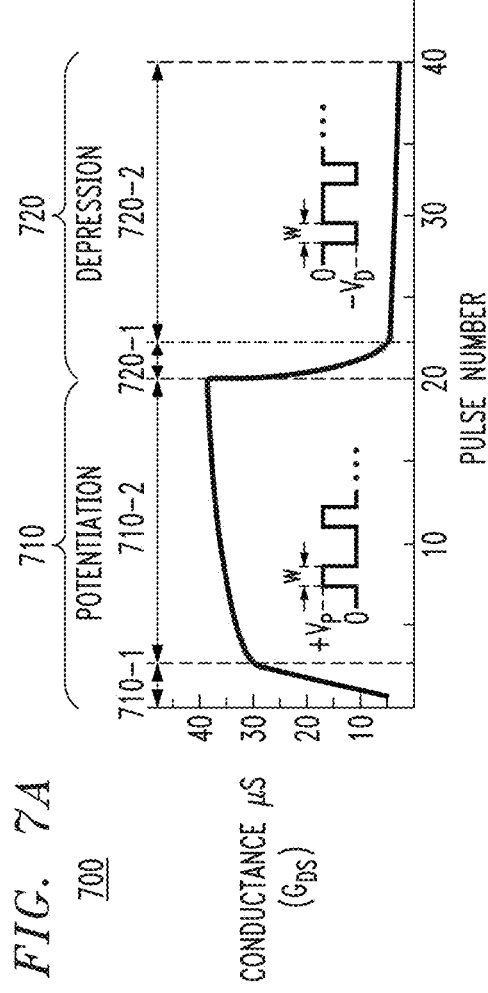
Figure 7B:
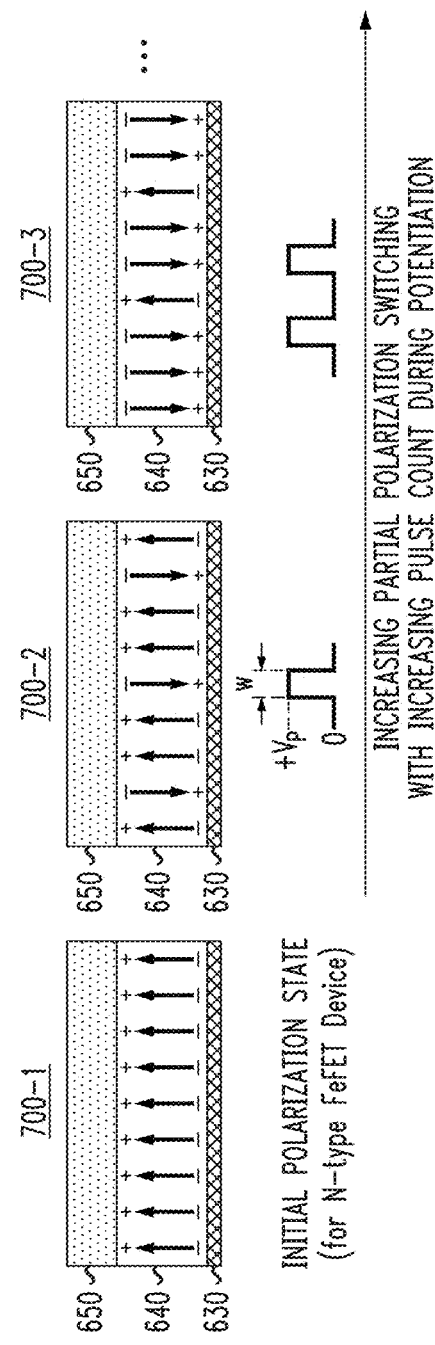

As noted above, the remnant polarization state of the ferroelectric layer 640 affects channel conductance of the FeFET device 600, wherein a change in the polarization state of the ferroelectric layer 640 (e.g., change in magnitude and/or polarity) causes a change in the channel conductance of the FeFET device 600. Exemplary embodiments of the disclosure exploit the dynamics of voltage controlled partial polarization switching in the ferroelectric layer 640 of the FeFET device 600, which is utilized as a select transistor in an analog non-volatile analog resistive memory cell, to modulate a channel conductance of the FeFET device 640 during a programming operation in a manner that improves the linearity in the conductance tuning of a resistive memory device during the programming operation (e.g., synapse weight update process). For example, FIGS. 7A and 7B schematically illustrate a process for utilizing multi-domain partial polarization switching in the ferroelectric layer 640 of the FeFET device 600 to modulate a threshold voltage ($V_T$) of the FeFET device 600 and, consequently a drain-to-source (channel) conductance of the FeFET device 600, by applying sequence of voltage pulses of the same amplitude and pulse width to the gate electrode 650, according to an exemplary embodiment of the disclosure. The exemplary embodiments of FIGS. 7A and 7B assume that the FeFET device 600 is an N-type FeFET device.

More specifically, FIG. 7A graphically illustrates a channel conductance Gas (in micro Siemens (μS)) of an FeFET device as a function of pulse number for a plurality of programming pulses applied to a gate of the FeFET device, according to an exemplary embodiment of the disclosure. In particular, FIG. 7A illustrates a curve 700 which shows an increase in the channel conductance Gas of the FeFET device 600 as a function of pulse number for a pulse pattern comprising potentiation pulses that are applied in a potentiation period 710 and depression pulses that are applied in a depression period 720. In the potentiation period 710, a sequence of potentiation pulses with the same amplitude $+V_P$ (e.g., +3.7 V) and pulse width W (e.g., 75 ns) are applied to the gate electrode 650 of the FeFET device 600, and in the depression period 720, a sequence of depression pulses with the same amplitude $-V_D$ (e.g., −3.2 V) and pulse width W (e.g., ns)) are applied to the gate electrode 650 of the FeFET device 600.

As shown in FIG. 7A, the potentiation pulses result in an asymmetric channel conductance response, wherein a first portion 710-1 of the potentiation period 710 shows an abrupt increase in the channel conductance GDs for a small number of initial potentiation pulses, and wherein a second portion 710-2 of the potentiation period 710 shows a near linear increase in the channel conductance GDs over a larger number of sequential potentiation pulses. Moreover, in the second portion 710-2 of the potentiation period 710, there is a relatively small linear increase in the channel conductance GDS, e.g., from about 30 μS to less than 40 resulting in a $G_{max}/G_{min}$ ratio of about 40/30=1.3 in the second portion 710-2 of the potentiation period 710.

As further shown in FIG. 7A, the application of the depression pulses (following the potentiation period 710) results in an asymmetric channel conductance response, wherein a first portion 720-1 of the depression period 720 shows an abrupt decrease in the channel conductance GDs for a small number of initial depression pulses, and wherein a second portion 720-2 of the depression period 720 shows a near linear decrease in the channel conductance GDS over a larger number of sequential depression pulses. Moreover, in the second portion 720-2 of the depression period 720, there is a relatively small linear decrease in the channel conductance GDS.

The change in channel conductance GDs as shown in FIG. 7A is the result of the modulation of the threshold voltage $V_T$ (and thus the channel conductance GDs) of the FeFET device 600 based on the partial polarization switching of ferroelectric domains in the ferroelectric layer 640 of the FeFET device 600. For example, FIG. 7B schematically illustrates different polarization states of the ferroelectric layer 640 of the FeFET device 600 which result from partial polarization switching in response to an increasing count of the potentiation pulses shown in FIG. 7A (with same amplitude $+V_P$ and pulse width W) during the potentiation period, according to an exemplary embodiment of the disclosure. FIG. 7B schematically illustrates different polarization states 700-1, 700-2, and 700-3 of the FeFET device 600, wherein each polarization state corresponds to a different threshold voltage $V_T$ of the FeFET device 600

More specifically, FIG. 7B schematically illustrates an initial polarization state 700-1 of the FeFET device 600 in which the ferroelectric domains of the ferroelectric layer 640 have a remnant polarization with a "first polarity" (e.g., a negative ferroelectric polarization) where the electric dipoles across the ferroelectric layer 640 are oriented with the positive poles directed to the gate electrode 650 and the negative poles directed to the channel region of the substrate 610 of the FeFET device 600. The polarization state 700-1 presents a net negative charge to the entire channel region in the upper surface of the substrate 610, thereby causing positive (majority) charge carriers from the substrate 610 to accumulate at the surface of the substrate 610 in the channel region. The net effect of the polarization state 700-1 is an increase in the threshold voltage of the FeFET device 600 such that the FeFET device 600 has a first threshold voltage $V_T1$.

Further, FIG. 7B schematically illustrates a polarization state 700-2 of the FeFET device 600 which results from applying one or more initial potentiation pulses to the gate electrode 650, which causes a switching of the remnant polarization of a portion of the ferroelectric domains in the ferroelectric layer 640 from the first polarity to a second polarity (e.g., a positive ferroelectric polarization) where the electric dipoles in the ferroelectric domains are oriented with the negative poles directed to the gate electrode 650 and the positive poles directed to the channel region of the substrate 610. As compared to the initial polarization state 700-1, the polarization state 700-2 presents a more negative charge (less net positive charge) to the upper surface of the substrate 610 in the channel region, which results in a decrease in the threshold voltage of the FeFET device 600 and thus an increase in the channel conductance relative to the initial polarization state 700-1.

Moreover, FIG. 7B schematically illustrates a polarization state 700-3 of the FeFET device 600 which results from applying one or more additional potentiation pulses to the gate electrode 650, which causes a further switching of the remnant polarization of a portion of the ferroelectric domains in the ferroelectric layer 640 from the first polarity to a second polarity where a greater number of electric dipoles of the ferroelectric domains are oriented with the negative poles directed to the gate electrode 650 and the positive poles directed to the channel region of the substrate 610. As compared to the polarization state 700-2, the polarization state 700-3 presents more negative charge to the upper surface of the substrate 610 in the channel region, which results in a further decrease in the threshold voltage of the FeFET device 600 and thus a further increase in the channel conductance relative to the previous polarization state 700-2.

FIG. 7B illustrates that an increase in the number of potentiation pulses (increase in pulse count) with the same amplitude +Vp and pulse W applied to the gate electrode 650 of the FeFET device 600 causes an increase in the partial polarization switching of ferroelectric domains from the first polarity to the second polarity. The partial polarization switching results in gradual decrease in the threshold voltage Vt of the FeFET device 600 and, thus, an increase in the channel conductance Gas of the FeFET device 600. Exemplary embodiments of the disclosure exploit this conductance-polarization property of the FeFET device 600 by utilizing the FeFET device 600 as a select transistor in an analog non-volatile analog resistive memory cell to improve the linearity in the conductance tuning of a resistive memory device during the programming operation (e.g., synapse weight update process) in which conductance tuning of the resistive memory device is performed using a sequence of identical programming pulses.

Figure 7C:
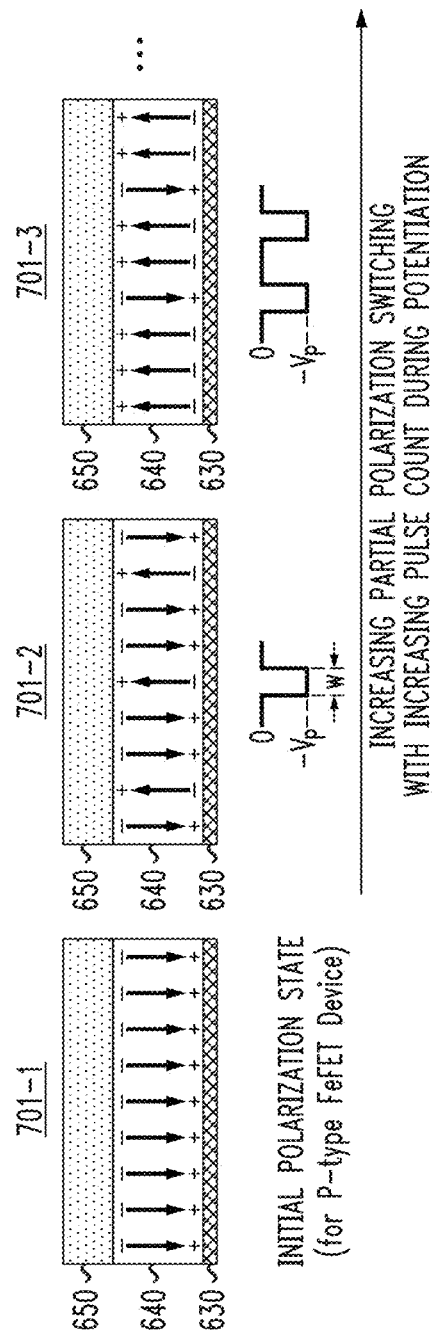

As noted above, the exemplary embodiments of FIGS. 7A and 7B assume that the FeFET device is an N-type FeFET device. It is to be understood that the same or similar principles apply for a P-type FeFET device. For example, FIG. 7C schematically illustrates an initial polarization state 701-1 of the FeFET device 600, wherein the FeFET device 600 assumed to be a P-type FeFET device, and wherein the ferroelectric domains of the ferroelectric layer 640 have a remnant polarization with the "second polarity" (e.g., a positive ferroelectric polarization) where the electric dipoles across the ferroelectric layer 640 are oriented with the negative poles directed to the gate electrode 650 and the positive poles directed to the channel region of the substrate 610 of the FeFET device 600. The polarization state 701-1 presents a net positive charge to the entire channel region in upper surface of the substrate 610, thereby causing negative (majority) charge carriers from the substrate 610 to accumulate at the surface of the substrate 610 in the channel region. The net effect of the polarization state 701-1 is an increase in the negative threshold voltage of the FeFET device 600 such that the FeFET device 600 has a first threshold voltage $-V_T1$.

Further, FIG. 7C schematically illustrates polarization states 701-2 and 701-3 of the P-type FeFET device 600 which results from applying negative polarity potentiation pulses to the gate electrode 650, which causes an increase partial switching of the remnant polarization of portions of the ferroelectric domains in the ferroelectric layer 640 from the second polarity to the first polarity where the electric dipoles in the ferroelectric domains are oriented with the positive poles directed to the gate electrode 650 and the negative poles directed to the channel region of the substrate 610. FIG. 7C illustrates that an increase in the number of negative potentiation pulses (increase in pulse count) with the same amplitude −Vp and pulse width W applied to the gate electrode 650 of the P-Type FeFET device 600 causes an increase in the partial polarization switching of ferroelectric domains from the second polarity to the first polarity. The partial polarization switching results in gradual decrease in the negative threshold voltage Vt of the FeFET device 600 and, thus, an increase in the channel conductance Gas of the FeFET device 600. To place the P-type FeFET device 600 back to its initial polarization state 700-1, one or more positive depression pulses (opposite in polarity to the depression pulses shown in FIG. 7A) are applied to the gate electrode 650 of the FeFET device 600.

It is well known that resistive memory devices such as the resistive switching device 400 of FIG. 4 and the PCM device of FIG. 5 exhibit non-linear conductance tuning when using potentiation/depression programming schemes with identical programming pulses. As such, to achieve linearity in the conductance tuning of such resistive memory devices, potentiation/depression pulse schemes typically implement non-identical pulse schemes which involve modulating either the amplitude or the pulse width of the potentiation/depression pulses. For example, modulating the pulse amplitude involves increasing the amplitude of the pulses (with a fixed pulse width) for each sequential programming pulse applied to the resistive memory device to linearly increase (potentiation) or decrease (depression) the conductance of the resistive memory device in identical incremental tuning steps. On the other hand, modulating the pulse width involves increasing the pulse width of the pulses (with a fixed amplitude) for each sequential programming pulse applied to the resistive memory device to linearly increase (potentiation) or decrease (depression) the conductance of the resistive memory device in identical incremental tuning steps. These non-identical pulse schemes add overhead with regard to the peripheral circuitry and processing that is needed to implement amplitude and/or pulse width modulation. In addition, pulse width modulation results in increased latency in the programming operations.

Figure 8A:
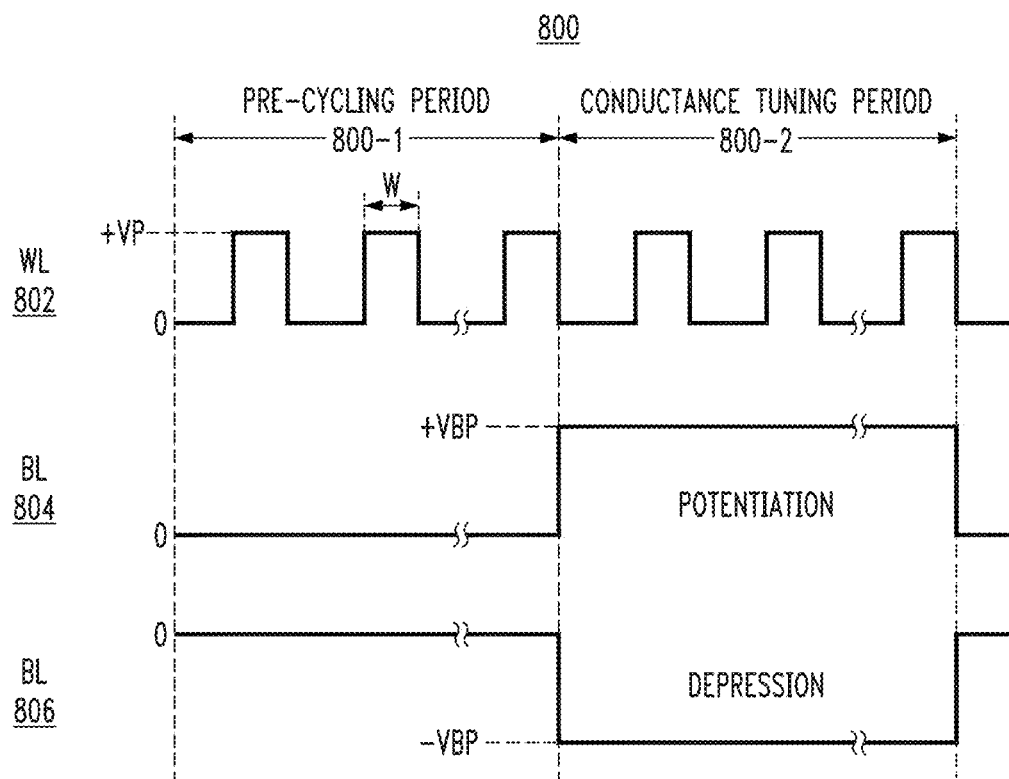
FIG. 8A is a timing diagram which illustrates methods for programming a non-volatile analog resistive memory cell which implements a ferroelectric select transistor and a resistive memory device, according to an exemplary embodiment of the disclosure.
Figure 8B:
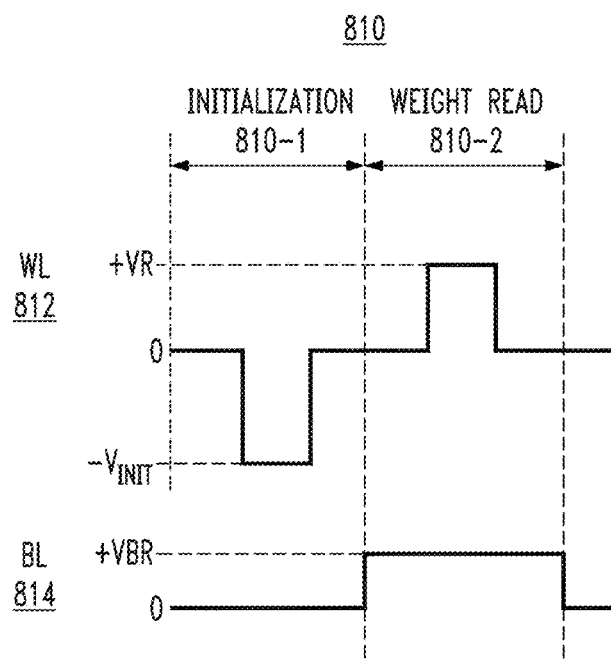
FIG. 8B is a timing diagram which illustrates a method for reading a state of a non-volatile analog resistive memory cell which implements a ferroelectric select transistor and a resistive memory device, according to an exemplary embodiment of the disclosure.

FIGS. 8A and 8B are timing diagrams that illustrate methods for programming and reading a non-volatile analog resistive memory cell which implements a ferroelectric select transistor, according to an exemplary embodiment of the disclosure. For purposes of illustration, FIGS. 8A and 8B will be discussed in the context of the non-volatile analog resistive memory cell 300 of FIG. 3. FIG. 8A illustrates methods 800 for programming the resistive memory cell 300 to tune the conductance of the resistive memory device 320 using a pulse scheme of identical pulses. In particular, FIG. 8A illustrates a sequence of programming pulses 802 that are applied to the word line WL and thus, applied to the gate electrode G of the FeFET select transistor 310, during a pre-cycling period 800-1 and a conductance tuning period 800-2. FIG. 8A further illustrates a potentiation control voltage 804 (or first conductance tuning control voltage) that is applied to the bit line BL to increase the conductance of the resistive memory device 320, or alternatively, a depression control voltage 806 (or second conductance tuning control voltage) that is applied to the bit line BL to decrease the conductance of the resistive memory device 320.

In the pre-cycling period 800-1, both the bit line BL and the source line SL are held at ground voltage GND (e.g., V=0), while a relatively small number of programming pulses 802 (e.g., 1-5 pulses) are applied to the word line WL to tune (e.g., increase) the conductance of the FeFET select transistor 310 to a desired level. The programming pulses 802 have a sufficient magnitude +VP and duration to cause the partial polarization switching of the ferroelectric domains within the ferroelectric layer of the FeFET select transistor 310. For example, in the context of the exemplary embodiments discussed above in conjunction with FIGS. 7A and 7B, the pre-cycling period 800-1 is performed to change the polarization state of the FeFET select transistor 310 from the initial state (e.g., state 700-1, FIG. 7B) to a target polarization state (e.g., state 700-3) in which the FeFET select transistor 310 has a reduced threshold voltage and wherein the behavior of the channel conductance GDS of the FeFET select transistor 310 would fall within the second portion 710-2 of the potentiation period 710 (FIG. 7A). In this manner, the FeFET select transistor 310 would be in a state in which the channel conductance Gas of the FeFET select transistor 310 would exhibit a relativity small incremental linear increase with additional programming pulses +VP applied to the gate electrode from the word line WL during the conductance tuning period 800-2.

In the conductance tuning period 800-2, a potentiation process can be initiated by applying the potentiation control signal 804 to the bit line BL. The potentiation control signal 804 has a magnitude +VBP and duration (pulse width) which is sufficient to incrementally increase the conductance of the resistive memory device 320 in response to each programming pulse 802 that is applied to the word line WL during the conductance tuning period 800-2. The assertion of each programming pulse on the word line WL during the conductance tuning period 800-1 causes the FeFET select transistor 310 to turn-on and allow programming current to flow from the bit line BL to the source line SL through the resistive memory device 320 to incrementally increase the conductance of the resistive memory device 320.

On the other hand, in the conductance tuning period 800-2, a depression process can be initiated by applying the depression control signal 806 to the bit line BL. The depression control signal 806 has a magnitude –VBP and duration (pulse width) which is sufficient to incrementally decrease the conductance of the resistive memory device 320 in response to each programming pulse 802 that is applied to the word line WL during the conductance tuning period 800-2. The assertion of each programming pulse on the word line WL during the conductance tuning period 800-1 causes the FeFET select transistor 310 to turn-on and allow programming current to flow from the source line SL to the bit line BL through the resistive memory device 320 to incrementally decrease the conductance of the resistive memory device 320.

The FeFET select transistor 310 serves to increase the linearity response in the incremental conductance change of the resistive memory device 320 while using a programming pulse scheme in which the programming pulses 802 are identical in amplitude and pulse width. The identical programming pulses 802 that are applied to the gate electrode of the FeFET select transistor 310 serve to modulate the polarization (and threshold voltage $V_T$) of the FeFET select transistor 310 in way that helps modulate and control the programming current that is generated during the conductance tuning period 800-1 to incrementally change the conductance of the resistive memory device 320 in a more linear manner.

More specifically, as noted above, during the pre-cycling period 800-1, the polarization (and threshold voltage $V_T$) of the FeFET select transistor 310 is modulated by the application of a relatively small number of programming pulses 802 to place the FeFET select transistor 310 in an operating state in which polarization/$V_T$/channel conductance of the FeFET device remains relatively flat while exhibiting a relatively small incremental increase in the channel conductance and a relatively small incremental decrease of the threshold voltage $V_T$ in response to further partial polarization switching that occurs in response to programming pulses that are applied to the gate of the FeFET select transistor 310 during the conductance tuning period 800-2. In other words, the pre-cycling period 800-1 is performed to ensure that there are no abrupt changes in the channel conductance Gas and threshold voltage $V_T$ of the FeFET select transistor 310 during the conductance tuning period 800-2.

Moreover, during the conductance tuning period 800-1, as programming pulses are applied on the word line WL to tune the conductance of the resistive memory device 320, the application of each programming pulse to the gate of the FeFET select transistor 310 causes a small change in the polarization state of the ferroelectric layer 640, which results in a small decrease in the threshold voltage $V_T$ of the FeFET select transistor 310. This results in a small increase in the channel conductance $G_{DS}$ of the FeFET select transistor 310 due to, e.g., an increase in $V_{GS}$–$V_T$ (or +VP –$V_T$), which in turn causes an increase in the channel current (IDs) of the FeFET select transistor 310.

In this manner, the increase in the channel conductivity (and thus increase in the channel current IDs) of the FeFET select transistor 310 for each successive programming pulse during the conductance tuning period 800-2 serves to incrementally increase the amount of programming current programming for tuning the resistive memory device 320. As such, the modulation of the channel conductance $G_{DS}$ and the threshold voltage $V_T$ of the FeFET select transistor 310 during the conductance tuning period 800-2 serves to increase the linear response in conductance tuning of the resistive memory device 320, while using a programming pulse scheme in which the programming pulses 802 are identical in amplitude and pulse width. In other words, the implementation of the FeFET select transistor 310 and the incremental modulation of the channel conductance Gas and threshold voltage $V_T$ of the FeFET select transistor 310 in conjunction with an identical programming pulse scheme, in effect, emulates a programming scheme in which the programming current is modulated by using a non-identical pulse scheme applied to the resistive memory cell to tune the conductance of the resistive memory device.

Figure 11A:
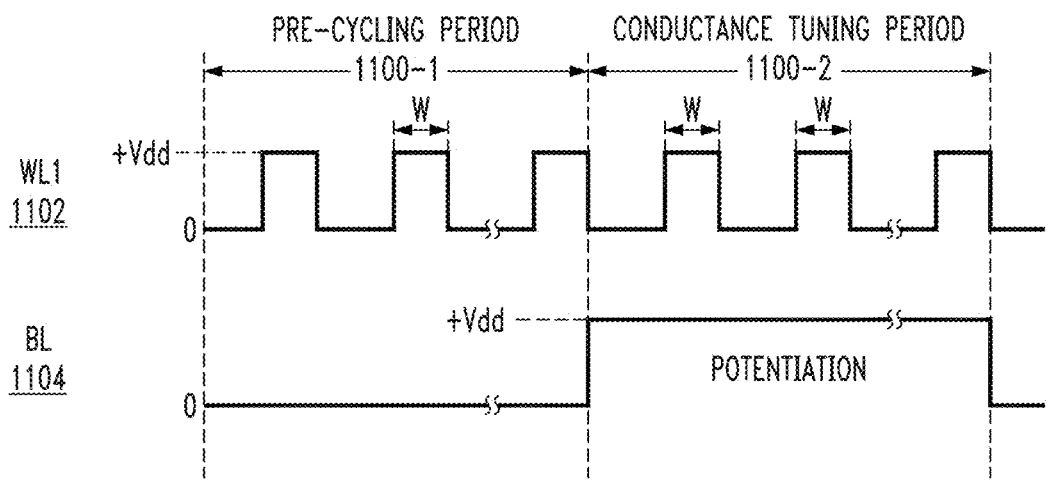
FIG. 11A is a timing diagram which illustrates a method for programming the non-volatile analog resistive memory cell of FIG. 10 using a potentiation pulse stream to increase a conductance of a resistive memory device, according to an exemplary embodiment of the disclosure.
Figure 11B:
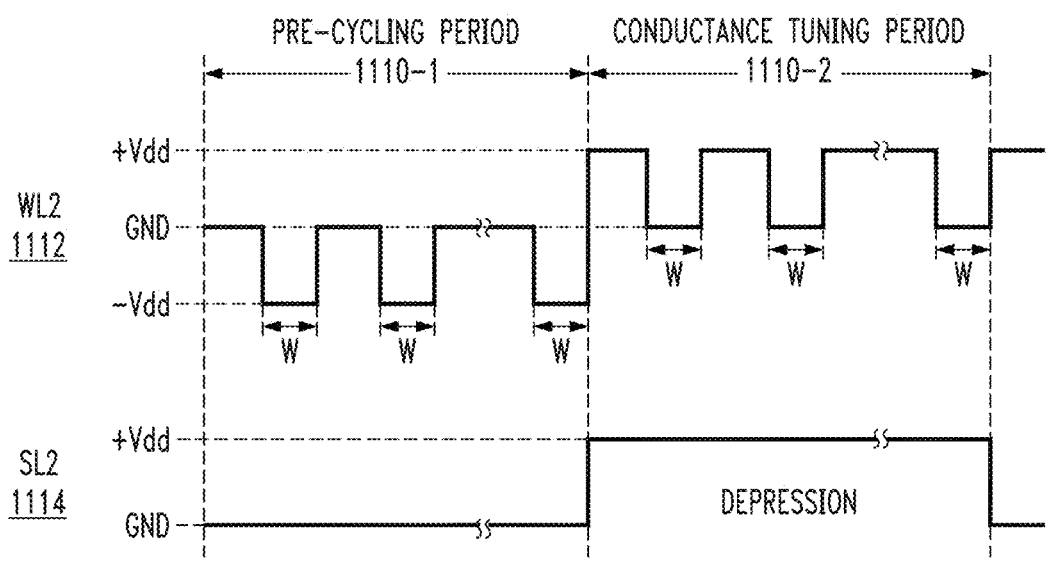
FIG. 11B is a timing diagram which illustrates a method for programming the non-volatile analog resistive memory cell of FIG. 10 using a depression pulse stream to decrease a conductance of a resistive memory device, according to an exemplary embodiment of the disclosure.

It is to be understood that the programming pulses 802 illustrated in FIG. 8A (as well as exemplary programming pulses 1102 and 1112 shown in FIGS. 11A and 11B) are presented for purposes of illustrating principles of operation for programming analog resistive memory devices using FeFET devices as select transistors. The programming pulses 802 in FIG. 8A (as well as the programming pulses 1102 and 1112, FIGS. 11A and 11B) can be generated using any suitable technique for performing weight update operations or memory programming operations in, e.g., RPU crossbar arrays, non-volatile analog resistive memory, neuromorphic computing systems, etc. For example, in RPU crossbar array systems, to support a RPU cell weight update operation (e.g., update conductance value of a resistive memory device of a given RPU cell 110, FIG. 1), a stochastic with update process can be implemented whereby the programming pulses in the conductance tuning period 800-2 of FIG. 8A (and in conductance tuning periods 1100-2 and 1110-2, FIGS. 11A and 11B) are generated in response to a coincidence detection between stochastic bit streams that represent the input vectors xi and δj (see, e.g., FIG. 2C), wherein the conductance of a given RPU cell will incrementally change (increase or decrease) in response to a coincidence of the xi and δj stochastic pulse streams associated with a given RPU cell, the details of which are well understood to those of ordinary skill in the art. Moreover, the programming pulses that are generated for the pre-cycling period 800-1 in FIG. 8A (and pre-cycling periods 1100-1 and 1110-1, FIGS. 11A and 11B) are generated by pulse generation circuitry in the peripheral circuitry, wherein in some embodiments, a pre-defined number of programming pulses (with a given magnitude and pulse width) are applied to the row lines to "prime" the FeFET select transistors to target polarization states.

FIG. 8B illustrates a method 810 for reading a state of the resistive memory cell 300. In particular, FIG. 8B illustrates read control pulses 812 that are applied to the word line WL and thus, applied to the gate electrode G of the FeFET select transistor 310, during an initialization period 810-1 and a weight read period 810-2. FIG. 8B further illustrates a read voltage signal 814 that is applied to the bit line BL to generate a read current (e.g., $I_{READ}$) that is sensed to determine a conductance state or resistance state (e.g., synaptic weight) of the resistive memory device 320. In the initialization period 810-1, both the bit line BL and the source line SL are held at ground voltage GND (e.g., V=0), while a polarization initialization pulse $-V_{INIT}$ (or reset pulse), is applied to the word line WL to switch the polarization of the FeFET select transistor 310 to an initial polarization state. For example, in some embodiments, the FeFET select transistor 310 is programmed to the initial polarization state 700-1 shown in FIG. 7B, wherein the FeFET select transistor 310 would have an increased threshold voltage and low channel conductance.

In some embodiments, assuming the FeFET select transistor 310 is an N-type device, the polarization initialization pulse $-V_{INIT}$ applied to the gate electrode of the FeFET select transistor 310 has a negative magnitude and a duration (pulse width) which is sufficient to abruptly switch the net polarization of the ferroelectric layer of the FeFET select transistor 310 from the second polarity to the first polarity to thereby place the channel in a low conductance state (or high $V_T$ state). For example, as shown in FIG. 7A, the application of a negative depression pulse to the gate electrode of an FeFET device during the initial period 720-1 of the depression period 720 results in an abrupt decrease in the channel conductance Gas (and thus an abrupt increase in the threshold voltage $V_T$) the FeFET device. In this manner, the initialization phase 810-1 places the FeFET select transistor 310 in a suitable operating mode (increased threshold voltage and low channel conductance) for reading the state of the memory cells by the application of a small magnitude read voltage to the bit line BL, as well as placing the FeFET select transistor 310 in the initial polarization state to facilitate programming the memory cell 300 in a next pre-cycling period 800-1 and conductance tuning period 800-2.

FIG. 8B further illustrates that the weight read period 810-1 is initiated by asserting the read voltage signal 814 with magnitude +VBR on the bit line BL following the initialization period 810-1. During the weight read period 810-1, following the assertion of the read voltage signal 814, a read control pulse 812 of magnitude +VR is applied to the word line WL. The read control pulse +VR has a magnitude and duration (pulse width) which is sufficient to turn-on the FeFET select transistor 310 and allow a read current $I_{READ}$ to flow from the bit line BL to the source line SL through the resistive memory device 320. In this process, the magnitude +VBR of the read voltage signal 814 is selected to have a magnitude which is smaller than the magnitude +VBP of the potentiation control signal 804, so that the read voltage signal 814 does not disturb (i.e., cause a change in the conductance) of the state of the resistive memory device 320. In the read process, the low-conductance state of the FeFET select transistor 310 together with the small magnitude +VBR of the read voltage signal 814 results in the generation of a relatively small read current $I_{READ}$ which is sufficient to read the state of the memory cell 300 without changing the state of the resistive memory device 320.

In some embodiments, the programming and read operations in FIGS. 8A and 8B are performed with the FeFET select transistor 310 operating in a "saturation mode" wherein $V_{GS} > V_T$ and $V_{DS} \geq (V_{GS} - V_T)$. In the saturation mode, for a given $V_{GS}$ and $V_T$, the drain current $I_D$ remains substantially constant, independent of $V_{DS}$. In this manner, operating the FeFET select transistor 310 in a saturation mode during, e.g., a programming operation, allows for further control of the programming current that the FeFET select transistor 310 contributes to the overall programming current that is used to tune the conductance of the resistive memory device 320.

It is to be noted that the exemplary FeFET device characteristics and behaviors as discussed above in conjunction with FIGS. 7A, 7B, and 7C are presented for illustrative purposes to explain principles of operation of FeFET transistors and the use of such FeFET devices as select transistors in non-volatile resistive memory cells to improve the linearity of conductance tuning of analog resistive memory devices which naturally have non-linear conductance switching characteristics. In this regard, the exemplary embodiments shown in, e.g., FIGS. 7A, 7B, and 7C, should not be construed in any limiting manner. For example, the conductance curve shown in FIG. 7A is merely an illustrative example, and that the conductance characteristics of an FeFET device can vary in many ways, depending on, e.g., the structural and electrical characteristics of the FeFET device, the magnitude and pulse width of the pulses that are used to modulate the polarization of the FeFET device, etc.

Moreover, it is to be understood that the magnitudes, polarities, pulse widths, etc., of the various control signals shown in FIGS. 8A and 8B (and as shown below in FIGS. 11A and 11B) will vary depending on various factors including, but not limited to, the structural and electrical characteristics of (i) the FeFET devices (used as select transistors) and (ii) the resistive memory devices that are used as storage elements in the non-volatile analog resistive memory cells, the dynamic range (e.g., number) of conductance states of the tunable resistive memory devices, etc. For example, the magnitude and pulse widths of the programming pulses that are used to modulate the polarization state of the FeFET devices (used as select transistors) and to modulate the conductance tuning of the resistive memory devices can be optimized to achieve desired conductance tuning behaviors as need for a given application. In other words, the magnitude and duration of the programming pulses (for an identical pulse scheme) can be designed to achieve a target response of the FeFET device with regard to the partial polarization switching of the FE domains of the ferroelectric layer, and thus, achieve a desired behavior/response in the threshold voltage and conductance modulation of the FeFET device which makes the FeFET device useful for its purpose as a select transistor to improve the linearity in the conductance tuning of a resistive memory device based on the principles discussed herein.

Figure 9:
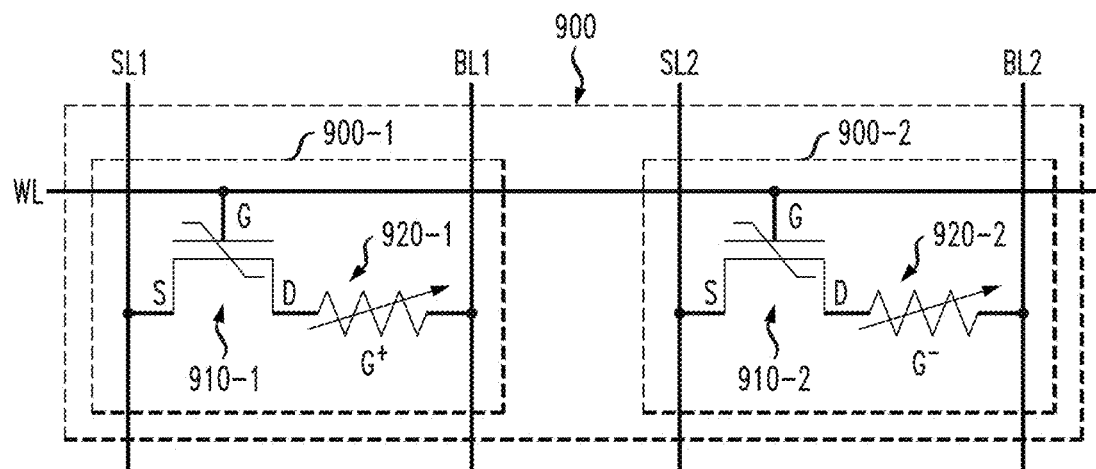
FIG. 9 schematically illustrates a non-volatile analog resistive memory cell which implements a ferroelectric select transistor and a resistive memory device, according to another exemplary embodiment of the disclosure.

Furthermore, while FIG. 3 schematically illustrates an exemplary embodiment of a non-volatile analog resistive memory cell 300 which comprises a 1T-1R architecture, it is to be understood that the same or similar techniques discussed herein for utilizing ferroelectric select transistors to enhance the linearity of analog memory elements can be implemented with other analog resistive memory cell architectures. For example, FIG. 9 schematically illustrates a non-volatile analog resistive memory cell which implements a ferroelectric select transistor, according to another exemplary embodiment of the disclosure. In particular, FIG. 9 schematically illustrates a non-volatile analog resistive memory cell 900 which combines first and second 1T-1R memory cells 900-1 and 900-2 (two unit cells) to implement a 2T-2R architecture (alternatively, 2F-2R architecture) comprising two ferroelectric select transistors and two resistive memory devices.

In particular, as shown in FIG. 9, the first resistive memory cell 900-1 comprises a first FeFET select transistor 910-1 and a first resistive memory device 920-1. The first FeFET select transistor 910-1 comprises a gate G terminal connected to a word line WL, a source S terminal connected to a first source line SL1, and a drain D terminal connected to one terminal of the first resistive memory device 920-1. The first resistive memory device 920-1 is connected between the drain D terminal and a first bit line BL1. The second resistive memory cell 900-2 comprises a second FeFET select transistor 910-2 and a second resistive memory device 920-2. The second FeFET select transistor 910-2 comprises a gate G terminal connected to the word line WL, a source S terminal connected to a second source line SL2, and a drain D terminal connected to one terminal of the second resistive memory device 920-2. The second resistive memory device 920-2 is connected between the drain D terminal and a second bit line BL2.

FIG. 9 provides an exemplary embodiment where the non-volatile analog resistive memory cell 900 comprises a pair of identical resistive memory cells 900-1 and 900-2 that store a conductance value based on a difference between a first conductance value $G^+$ and a second conductance value $G^-$. In particular, as shown in FIG. 9, the first memory cell 900-1 encodes a first conductance value G+, and the second memory cell 900-2 encodes a second conductance value $G^-$, wherein the overall conductance value of the 2F-2R analog resistive memory cell 900 is proportional to the difference of the first and second conductance values, i.e., $G^+$-$G^-$.

In some embodiments, the first and second resistive memory cells 900-1 and 900-2 are adjacent memory cells in a given row of a 2D array of analog resistive memory cells (e.g., adjacent RPU cells 110 in the RPU array 100, FIG. 1). In such embodiments, the gate G terminals of the first and second FeFET select transistors 910-1 and 910-2 are connected to the same word line WL, while the source S terminals of the first and second FeFET select transistors 910-1 and 910-2 are connected to separate (adjacent) source lines SL1 and SL2, respectively, and the first and second resistive memory devices 920-1 and 920-2 are connected to separate (adjacent) bit lines BL1 and BL2, respectively. In other embodiments, the first and second resistive memory cells 900-1 and 900-2 disposed in identical positions in a pair of separate and identical 2D array of analog resistive memory cells (e.g., two separate and identical RPU arrays), wherein a first 2D array is configured to encode the positive weight values, and the second 2D array is used to encode the negative weight values. The first and second pair of 2D arrays can be stacked on top of each other in a back-end-of line structure.

The exemplary embodiment of FIG. 9 can be implemented in instances where the type of resistive memory technology that is used to implement the analog resistive memory cells does not readily support bidirectional modulation. For example, PCM devices are typically configured to support conductance tuning in one direction (e.g., potentiation) providing many intermediate conductance states to support MLC, while conductance tuning in the opposite direction (e.g., depression) is abrupt and returns to an extreme conductance state after one or several pulses, thereby providing no intermediate conductance states. In addition, since conductance values cannot be negative in the restive memory devices, the exemplary embodiment of FIG. 9 can be implemented in instances where the given application (e.g., SGD for deep learning of neural networks) requires signed weights.

The first and second 1F-1R memory cells 900-1 and 900-2 of the 2F-2R non-volatile analog resistive memory cell 900 operate in the same or similar manner as discussed above in conjunction with FIGS. 7A, 7B, 8A and 8B. The first memory cell 900-1 supports potentiation tuning by applying a potentiation control signal (e.g., +VBP signal 804, FIG. 8A) to the first bit line BL1 to tune conductance of the first resistive memory device 920-1, while the second memory cell 900-2 supports potentiation tuning by applying a potentiation control signal 806 (FIG. 8A) to the second bit line BL2 to tune the conductance of the second resistive memory device 920-2. The overall conductance value G of the 2F-2R non-volatile analog resistive memory cell 900 corresponds to $G^+$-$G^-$, wherein the sign of G is deemed positive when $G^+$-$G^-$>0, and deemed negative when $G^+$-$G^-$<0, as is understood by those of ordinary skill in the art. The conductance states of the resistive memory devices 920-1 and 920-2 can be "reset" back to initial conductance state when needed (e.g., a Reset (amorphizing) pulse applied to a PCM device to initialize the PCM device to an HRS). Moreover, the first and second FeFET select transistor 910-1 and 910-2 are periodically refreshed (initialized to a target polarization state) by connecting the source lines SL1 and SL2 and the first and second bit lines BL1 and BL2 to ground GND voltage (e.g., V=0V), and applying negative initialization pulses to the word line WL (e.g., $-V_{INT}$ pulse, FIG. 8B).

Figure 10:
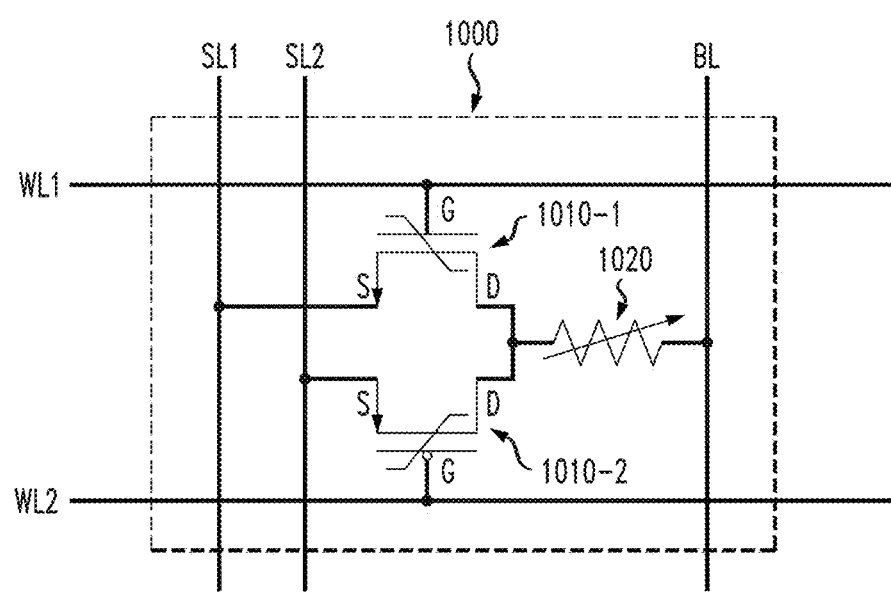
FIG. 10 schematically illustrates a non-volatile analog resistive memory cell which implements a ferroelectric select transistor and a resistive memory device, according to another exemplary embodiment of the disclosure.

FIG. 10 schematically illustrates a non-volatile analog resistive memory cell which implements a ferroelectric select transistor, according to another exemplary embodiment of the disclosure. In particular, FIG. 10 schematically illustrates a non-volatile analog resistive memory cell 1000 which comprises a first FeFET select transistor 1010-1, a second FeFET select transistor 1010-2, and a resistive memory device 1020. The first FeFET select transistor 1010-1 is an N-type FeFET device, while the second FeFET select transistor 1010-2 is a P-type FeFET device. The first FeFET select transistor 1010-1 comprises a gate G terminal connected to a first word line WL1, and the second FeFET select transistor 1010-2 comprises a gate G terminal connected to a second word line WL2, wherein the first and second word lines WL1 and WL2 comprise complementary word lines with respect to the non-volatile analog resistive memory cell 1000. The first and second FeFET select transistors 1010-1 and 1010-2 have source S terminals connected to respective first and second source lines SL1 and SL2, and drain D terminals connected to one terminal of the resistive memory device 1020. The resistive memory device 1020 is connected between the drain D terminals and a bit line BL.

In the exemplary embodiment of FIG. 10, it is assumed that the resistive memory device 1020 comprises bidirectional tunable conductance characteristics. For example, in some embodiments, the resistive memory device 1020 comprises a resistive switching device such as an interfacial resistive switching device or a filamentary resistive switching device as shown in FIG. 4. With bidirectional conductance tuning, the resistance of the resistive memory device 1020 will increase or decrease based on the polarity of the programming pulses and voltages applied to the word lines WL1 and WL2 and the bit line BL, allowing the conductance of the resistive memory device 1020 to increase by potentiation or decrease by depression. The first FeFET select transistor 1010-1 is utilized for potentiation and the second FeFET select transistor 1010-2 is utilized for depression. While the bidirectional conductance tuning of the resistive memory device 1020 may be non-linear under circumstances where an identical pulse stream for potentiation or an identical pulse stream for depression is applied to the resistive memory device 1020, the first and second FeFET select transistors 1010-1 and 1010-2 serve to improve the linearity of the bidirectional conductance tuning of the resistive memory device 1020 based on principles as discussed herein.

For example, FIG. 11A is a timing diagram which illustrates a method for programming the non-volatile analog resistive memory cell 1000 of FIG. 10 using a potentiation pulse stream to increase a conductance of the resistive memory device 1020, according to an exemplary embodiment of the disclosure. More specifically, FIG. 11A illustrates an exemplary programming operation 1100 in which the first FeFET select transistor 1010-1 (N-type) is utilized to increase the conductance of the resistive memory device 1020. The programming operation 1100 comprises a pre-cycling period 1100-1 and a conductance tuning (potentiation) period 1100-2. FIG. 11A illustrates an exemplary sequence of programming pulses 1102 that are applied to the first word line WL1, and a potentiation control voltage 1104 that is applied to the bit line BL during the programming operation 1100. During the entire programming operation 1100, the second word line WL2, and the first and second source lines SL1 and SL2 are all held at ground GND voltage (e.g., V=0). In this manner, the second FeFET select transistor 1010-2 (P-type) remains in a "turned-off" state during the programming operation 1100.

The programming operation 1100 commences with the pre-cycling period 1100-1 in which the polarization state of the first FeFET select transistor 1010-1 (N-type) is modulated using one or more programming pulses prior to the conductance tuning (potentiation) period 1100-2. At the start of the pre-cycling period 1100-1, it is assumed that the first FeFET select transistor 1010-1 has an initial polarization state, e.g., the initial polarization state 700-1 as shown in FIG. 7B. Based on operating principles as discussed above, the pre-cycling period 1100-1 is performed to place the first FeFET select transistor 1010-1 in a partial polarized state in which the first FeFET select transistor 1010-1 exhibits a relatively small and linear increase in its channel conductance Gas in response to subsequent programming pulses that are applied on the first word line WL1 during the conductance tuning period 1100-2. During the pre-cycling period 1100-1, the potentiation control voltage 1104 on the bit line BL is held at ground voltage GND (e.g., V=0), while a relatively small number of programming pulses 1102 (e.g., 1-5 pulses) are applied to the first word line WL1 to modulate the polarization state (e.g., decrease the threshold voltage, and increase the channel conductance) of the first FeFET select transistor 1010-1 to a desired level.

Following the pre-cycling period 1100-1, the conductance tuning (potentiation) period 1100-2 commences by increasing the potentiation control voltage 1104 on the bit line BL from ground GND voltage to a target programming voltage level (e.g., +Vdd). During the conductance tuning period 1100-2, a sequence of one or more identical programming pulses 1102 with a positive polarity (e.g., +Vdd) and a given pulse width W are applied to the first word line WL1 to incrementally increase the conductance of the resistive memory device 1020 in response to each programming pulse that is applied to the first word line WL1 during the conductance tuning (potentiation) period 1100-2. The assertion of each programming pulse on the first word line WL1 during the conductance tuning period 1100-2 causes the first FeFET select transistor 1010-1 to turn-on and allow programming current to flow from the bit line BL to the first source line SL1 through the resistive memory device 1020 and, thereby, incrementally increase the conductance of the resistive memory device 1020. In addition, the assertion of each programming pulse on the first word line WL1 during the conductance tuning period 1100-2 further modulates the polarization of the first FeFET select transistor 1010-1, resulting in a small increase in the channel conductance of the first FeFET select transistor 1010-1, which serves to improve the linearity in the potentiation tuning of the resistive memory device 1020, for reasons as discussed above.

Next, FIG. 11B is a timing diagram which illustrates a method for programming the non-volatile analog resistive memory cell 1000 of FIG. 10 using a depression pulse stream to decrease a conductance of the resistive memory device 1020, according to an exemplary embodiment of the disclosure. More specifically, FIG. 11B illustrates an exemplary programming operation 1110 in which the second FeFET select transistor 1010-2 (P-type) is utilized to decrease the conductance of the resistive memory device 1020. The programming operation 1110 comprises a pre-cycling period 1110-1 and a conductance tuning (depression) period 1110-2. FIG. 11B illustrates an exemplary sequence of programming pulses 1112 that are applied to the second word line WL2, and a depression control voltage 1114 that is applied to the second source line SL2 during the programming operation 1110. During the entire programming operation 1110, the first word line WL1, the first source line SL1, and the bit line BL are all held at ground GND voltage (e.g., V=0). In this manner, the first FeFET select transistor 1010-1 (N-type) remains in a "turned-off" state during the programming operation 1110.

The programming operation 1110 commences with the pre-cycling period 1110-1 in which the polarization state of the second FeFET select transistor 1010-2 (P-type) is modulated using one or more programming pulses prior to the conductance tuning (depression) period 1110-2. At the start of the pre-cycling period 1110-1, it is assumed that the second FeFET select transistor 1010-2 has an initial polarization state, e.g., the initial polarization state 701-1 as shown in FIG. 7C. Based on operating principles as discussed above, the pre-cycling period 1110-1 is performed to place the second FeFET select transistor 1010-2 in a partial polarized state in which the second FeFET select transistor 1010-2 exhibits a relatively small and linear increase in its channel conductance Gas in response to subsequent programming pulses that are applied on the second word line WL2 during the conductance tuning period 1110-2. During the pre-cycling period 1110-1, the depression control voltage 1114 on second source line SL2 is held at ground voltage GND (e.g., V=0), while a relatively small number of programming pulses 1112 (e.g., 1-5 pulses) are applied to the second word line WL2 to modulate the polarization state (e.g., decrease the threshold voltage, and increase the channel conductance) of the second FeFET select transistor 1010-2 to a desired level. As shown in FIG. 11B, the programming pulses in the pre-cycling period 1110-1 have a negative polarity amplitude (e.g., −Vdd) and a given pulse width W.

Following the pre-cycling period 1110-1, the conductance tuning (depression) period 1110-2 commences by increasing the depression control voltage 1114 on the second source line SL2 from ground GND voltage to a target programming voltage level (e.g., +Vdd). During the conductance tuning period 1110-2, a sequence of one or more identical programming pulses 1102 are applied to the second word line WL2 to incrementally decrease the conductance of the resistive memory device 1020 in response to each programming pulse that is applied to the second word line WL2 during the conductance tuning (depression) period 1110-2. In the exemplary embodiment of FIG. 11B, the programming pulses in the conductance tuning (depression) period 1110-2 are "active low" pulses (in contrast to the "active high" programming pulses in the conductance (potentiation) period 1100-2), wherein the programming pulses have a magnitude of GND voltage (e.g., V=0) and a given width W, as shown in FIG. 11B. In this regard, the assertion (e.g., transition of WL2 to GND voltage) of each programming pulse on the second word line WL2 during the conductance tuning period 1120-2 causes the second FeFET select transistor 1010-2 to turn-on and allow programming current to flow from the second source line SL2 to the bit line BL through the resistive memory device 1020 and, thereby, incrementally decrease the conductance of the resistive memory device 1020. In addition, the assertion of each programming pulse on the second word line WL2 during the conductance tuning period 1110-2 further modulates the polarization of the second FeFET select transistor 1010-2, resulting in a small increase in the channel conductance of the second FeFET select transistor 1010-2, which serves to improve the linearity in the depression tuning of the resistive memory device 1020, for reasons as discussed above.

In some embodiments, a method for reading the non-volatile analog resistive memory cell 1000 of FIG. 10 is similar to the method shown in FIG. 8B. In particular, in some embodiments, the conductance state of the non-volatile analog resistive memory cell 1000 of FIG. is performed using the first FeFET select transistor 1010-1 (N-type), while the second FeFET select transistor 1010-2 (P-type) is maintained in a "turned-off" state during the read operation. For example, prior to performing a read operation, the first FeFET select transistor 1010-1 is initialized to an initial polarization state (e.g., state 700-1, FIG. 7B). This initialization process is performed by connecting each of the bit line BL, the first and second source lines SL1 and SL2, and the second word line WL2 to ground GND voltage (e.g., V=0), and applying a polarization initialization pulse −V$_{INIT}$ (or reset pulse) (see, e.g., FIG. 8B) to the first word line WL1 to switch the polarization of the first FeFET select transistor 1010-1 to an initial polarization state.

Following the initialization, a read operation is initiated by asserting a read voltage signal (see, e.g., FIG. 8B) with magnitude +VBR on the bit line BL, and then applying a read control pulse on the first word line WL1. The read control pulse has a magnitude and duration (pulse width) which is sufficient to turn-on the first FeFET select transistor 1010-1 and allow a read current I$_{READ}$ to flow from the bit line BL to the first source line SL1 through the resistive memory device 1020. In the read process, the low-conductance state of the first FeFET select transistor 1010-1 together with the small magnitude of the read voltage signal on the bit line BL results in the generation of a relatively small read current I$_{READ}$ which is sufficient to read the state of the memory cell 1000 of FIG. 10 without changing the state of the resistive memory device 1020.

It is to be noted the second FeFET select transistor 1010-2 (P-type) is periodically initialized into an initial polarization state (e.g., state 701-1, FIG. 7C) so that the second FeFET select transistor 1010-2 is ready for a pre-cycling operation (e.g., 1110-1, FIG. 11B) that is performed prior to a conductance depression tuning operation. In some embodiments, the second FeFET select transistor 1010-2 is initialized to an initial polarization state by connecting each of the bit line BL, the first and second source lines SL1 and SL2, and the first word line WL1 to ground GND voltage (e.g., V=0), and applying a polarization initialization pulse +V$_{INIT}$ (or reset pulse) to the second word line WL2 to switch the polarization of the second FeFET select transistor 1010-2 to the initial polarization state. For the second FeFET select transistor 1010-2 (P-type), the initialization pulse +V$_{INIT}$ applied to the gate electrode of the second FeFET select transistor 1010-2 has a positive magnitude and duration (pulse width) which is sufficient to abruptly switch the net polarization of the ferroelectric layer of the second FeFET select transistor 1010-2 to a polarization polarity (see, e.g., polarization state 701-1, FIG. 7C) in which the second FeFET select transistor 1010-2 is in a low conductance state (or high V$_T$ state).

It is to be understood that the exemplary non-volatile analog resistive memory devices described herein can be employed in various applications, hardware, and/or electronic systems. Suitable hardware and systems for implementing the exemplary embodiments disclose herein may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising programming a non-volatile analog resistive memory cell which comprises a ferroelectric field-effect transistor (FeFET) device and a resistive memory device coupled to the FeFET device, wherein programming the non-volatile analog resistive memory cell comprises applying a sequence of programming pulses to the non-volatile analog resistive memory cell for modulating a polarization state of the FeFET device and affecting a linear response in a conductance tuning of the resistive memory device in response to modulating the polarization state of the FeFET device.

2. The method of claim 1, wherein applying the sequence of programming pulses to the non-volatile analog resistive memory cell comprises applying a sequence of voltage pulses having a same amplitude and same pulse width.

3. The method of claim 1, wherein:
the FeFET device comprises a gate terminal, a source terminal, and a drain terminal, wherein the gate terminal is coupled to a word line, the source terminal is coupled to a source line, and the drain terminal is coupled to a first terminal of the resistive memory device;
the resistive memory device comprises a second terminal coupled to a bit line; and
applying the sequence of programming pulses to the non-volatile analog resistive memory cell comprises applying a sequence of voltage pulses having a same amplitude and same pulse width to the word line.

4. The method of claim 1, wherein applying the sequence of programming pulses to the non-volatile analog resistive memory cell comprises:
applying a first sequence of programming pulses to the FeFET device during an initialization period to change a polarization state of the FeFET device from an initial state to a target polarization state, without changing a conductance of the resistive memory device during the initialization period;
applying a second sequence of programming pulses to the FeFET device during a conductance tuning period, following the initialization period, to further modulate a polarization state of the FeFET device starting from the target polarization state; and
applying a potentiation voltage to the non-volatile analog resistive memory cell during the conductance tuning period to cause an incremental increase of the conductance of the resistive memory cell in response to each programming pulse of the second sequence of programming pulses applied to the FeFET device.

5. The method of claim 1, wherein applying the sequence of programming pulses to the non-volatile analog resistive memory cell comprises:
applying a first sequence of programming pulses to the FeFET device during an initialization period to change a polarization state of the FeFET device from an initial state to a target polarization state, without changing a conductance of the resistive memory device during the initialization period;
applying a second sequence of programming pulses to the FeFET device during a conductance tuning period, following the initialization period, to further modulate a polarization state of the FeFET device starting from the target polarization state; and
applying a depression voltage to the non-volatile analog resistive memory cell during the conductance tuning period to cause an incremental decrease of the conductance of the resistive memory cell in response to each programming pulse of the second sequence of programming pulses applied to the FeFET device.

6. A method, comprising:
applying programming pulses on a word line to program a non-volatile analog resistive memory cell coupled to the word line, wherein the non-volatile analog resistive memory cell comprises a select transistor comprising a ferroelectric field-effect transistor (FeFET) device which is connected to the word line, and a resistive memory device connected to the FeFET device;
wherein the application of the programming pulses causes:
modulating a polarization state of the FeFET device in response to the programming pulses applied to the FeFET device from the word line, wherein the modulation of the polarization state of the FeFET device causes a modulation of a programming current for tuning a conductance of the resistive memory device; and
tuning the conductance of the resistive memory device by incrementally changing the conductance of the resistive memory device by the modulated programming current which is generated upon an activation of the FeFET device in response to each programming pulse applied to the FeFET device.

7. The method of claim 6, wherein the programming pulses comprise a sequence of voltage pulses which have a same amplitude and same pulse width.

8. The method of claim 6, further comprising performing a pre-cycling process to modulate the polarization state of the FeFET device prior to tuning the conductance of the resistive memory device, wherein the pre-cycling process comprises applying one or more pulses to the FeFET device from the word line to modulate the polarization state of the FeFET device from an initial polarization state to a target polarization state, without turning on the FeFET device during the pre-cycling process.

9. The method of claim 8, wherein the target polarization state corresponds to target threshold voltage and associated channel conductance of the FeFET device, wherein starting from the target polarization state, the FeFET device exhibits a substantially linear increase in the channel conductance of the FeFET device in response to the programming pulses that are applied to the FeFET device to further modulate the polarization of the FeFET device and thereby modulate the programming current that is generated to tune the conductance of the resistive memory device.

10. The method of claim 6, further comprising performing a read operation to determine a conductance state of the non-volatile analog resistive memory cell, wherein performing the read operation comprises:
performing an initialization process which comprises applying an initialization control pulse on the word line to change a polarization state of the FeFET device to an initial polarization state, while maintaining the FeFET device in an off state; and
performing a read process following the initialization process, wherein the read process comprises applying a read pulse on the word line to activate the FeFET device and generate a read current which represents the conductance state of the resistive memory device.

11. The method of claim 6, wherein tuning the conductance of the resistive memory device comprises:
applying a potentiation tuning control voltage to a bit line, wherein the resistive memory device is serially connected between the bit line and the FeFET device; and
incrementally increasing the conductance of the resistive memory device in response to each programming pulse applied to the FeFET device.

12. The method of claim 6, wherein tuning the conductance of the resistive memory device comprises:
applying a depression tuning control voltage to a bit line, wherein the resistive memory device is serially connected between the bit line and the FeFET device; and
incrementally decreasing the conductance of the resistive memory device in response to each programming pulse applied to the FeFET device.

13. The method of claim 6, wherein the resistive memory device comprises a resistive switching device.

14. The method of claim 6, wherein the resistive memory device comprises a phase-change memory device.

15. A method, comprising:
applying programming pulses on one of a first word line and a second word line to program a non-volatile analog resistive memory cell coupled to the first word line and the second word line, wherein the non-volatile analog resistive memory cell comprises a first select transistor comprising a first ferroelectric field-effect transistor (FeFET) device which is connected to the first word line, a second select transistor comprising a second FeFET device which is connected to the second word line, and a resistive memory device connected to the first and second FeFET devices;
wherein the application of the programming pulses on the first word line causes:
modulating a polarization state of the first FeFET device in response to the programming pulses applied to the first FeFET device from the first word line, wherein the modulation of the polarization state of the first FeFET device causes a modulation of a programming current for tuning a conductance of the resistive memory device; and
tuning the conductance of the resistive memory device by incrementally increasing the conductance of the resistive memory device by the modulated programming current which is generated upon an activation of the first FeFET device in response to each programming pulse applied to the first FeFET device, while the second FeFET device is maintained in an off state; and
wherein the application of the programming pulses on the second word line causes:
modulating a polarization state of the second FeFET device in response to the programming pulses applied to the second FeFET device from the second word line, wherein the modulation of the polarization state of the second FeFET device causes a modulation of the programming current for tuning the conductance of the resistive memory device; and
tuning the conductance of the resistive memory device by incrementally decreasing the conductance of the resistive memory device by the modulated programming current which is generated upon an activation of the second FeFET device in response to each programming pulse applied to the second FeFET device, while the first FeFET device is maintained in an off state.

16. The method of claim 15, wherein the programming pulses comprise a sequence of voltage pulses which have a same amplitude and same pulse width.

17. The method of claim 15, further comprising:
performing a first pre-cycling process to modulate the polarization state of the first FeFET device prior to tuning the conductance of the resistive memory device, wherein the first pre-cycling process comprises applying one or more pulses to the first FeFET device from the first word line to modulate the polarization state of the first FeFET device from a first initial polarization state to a first target polarization state, without turning on the first and second FeFET devices during the first pre-cycling process; and
performing a second pre-cycling process to modulate the polarization state of the second FeFET device prior to tuning the conductance of the resistive memory device, wherein the second pre-cycling process comprises applying one or more pulses to the second FeFET device from the second word line to modulate the polarization state of the second FeFET device from a second initial polarization state to a second target polarization state, without turning on the first and second FeFET devices during the second pre-cycling process.

18. The method of claim 17, wherein:
the first target polarization state corresponds to a first target threshold voltage and associated channel conductance of the first FeFET device, wherein starting from the first target polarization state, the first FeFET device exhibits a substantially linear increase in the channel conductance of the first FeFET device in response to the programming pulses that are applied to the first FeFET device from the first word line to further modulate the polarization of the first FeFET device and thereby modulate the programming current that is generated to tune the conductance of the resistive memory device; and
the second target polarization state corresponds to a second target threshold voltage and associated channel conductance of the second FeFET device, wherein starting from the second target polarization state, the second FeFET device exhibits a substantially linear increase in the channel conductance of the second FeFET device in response to the programming pulses that are applied to the second FeFET device from the second word line to further modulate the polarization of the second FeFET device and thereby modulate the programming current that is generated to tune the conductance of the resistive memory device.

19. The method of claim 15, further comprising performing a read operation to determine a conductance state of the non-volatile analog resistive memory cell, wherein performing the read operation comprises:
performing an initialization process which comprises applying an initialization control pulse on the first word line to change a polarization state of the first FeFET device to an initial polarization state, while maintaining the first and second FeFET devices in an off state; and
performing a read process following the initialization process, wherein the read process comprises applying a read pulse on the first word line to activate the first FeFET device and generate a read current which represents the conductance state of the resistive memory device, while maintaining the second FeFET device in an off state.

20. The method of claim 15, wherein the first FeFET device comprises an N-type device, wherein the second FeFET device comprises a P-type device, and wherein the resistive memory device comprises a resistive switching device which comprises a bidirectional tunable conductance.

* * * * *